(12) United States Patent
Brodsky et al.

(10) Patent No.: US 9,059,194 B2
(45) Date of Patent: Jun. 16, 2015

(54) HIGH-K AND METAL FILLED TRENCH-TYPE EDRAM CAPACITOR WITH ELECTRODE DEPTH AND DIMENSION CONTROL

(71) Applicant: International Business Machines Corporation, Armonk, NY (US)

(72) Inventors: Colin J. Brodsky, Salt Point, NY (US); Anne C. Friedman, Fishkill, NY (US); Herbert Lei Ho, New Windsor, NY (US); Byeong Yeol Kim, Lagrangeville, NY (US); Dan Mihai Mocuta, Lagrangeville, NY (US); Garrett W. Oakley, Poughkeepsie, NY (US); Chienfan Yu, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/738,170

(22) Filed: Jan. 10, 2013

(65) Prior Publication Data
US 2014/0191366 A1    Jul. 10, 2014

(51) Int. Cl.
*H01L 21/8242* (2006.01)
*H01L 27/108* (2006.01)
*H01L 29/66* (2006.01)

(52) U.S. Cl.
CPC .... *H01L 29/66181* (2013.01); *H01L 27/10829* (2013.01); *H01L 27/1087* (2013.01)

(58) Field of Classification Search
CPC .............. H01L 27/10861; H01L 27/10864; H01L 27/10867; H01L 27/1087; H01L 27/10829
USPC ......... 438/243, 249, 637, 671, 694, 696, 699, 438/700, 702, 703
See application file for complete search history.

(56) References Cited

U.S. PATENT DOCUMENTS

| | | | |
|---|---|---|---|
| 6,140,208 A | 10/2000 | Agahi et al. | |
| 7,741,188 B2 | 6/2010 | Dyer et al. | |
| 8,241,981 B1 | 8/2012 | Krishnan et al. | |
| 2009/0068841 A1* | 3/2009 | Matsui et al. | 438/693 |
| 2009/0197422 A1* | 8/2009 | Kang et al. | 438/717 |
| 2012/0171821 A1 | 7/2012 | Cheng et al. | |
| 2012/0187523 A1 | 7/2012 | Cummings et al. | |
| 2012/0211814 A1 | 8/2012 | Cheng | |

* cited by examiner

*Primary Examiner* — Matthew W Such
*Assistant Examiner* — Scott Stowe
(74) *Attorney, Agent, or Firm* — Whitham Curtis Christofferson & Cook, PC; Joseph P. Abate

(57) ABSTRACT

Partial removal of organic planarizing layer (OPL) material forms a plug of OPL material within an aperture that protects underlying material or electronic device such as a deep trench capacitor during other manufacturing processes. The OPL plug thus can absorb any differences or non-uniformity in, for example, etch rates across the chip or wafer and preserve recess dimensions previously formed. Control of a lateral component of later removal of the OPL plug by etching also can increase tolerance of overlay error in forming connections and thus avoid loss in manufacturing yield.

17 Claims, 30 Drawing Sheets

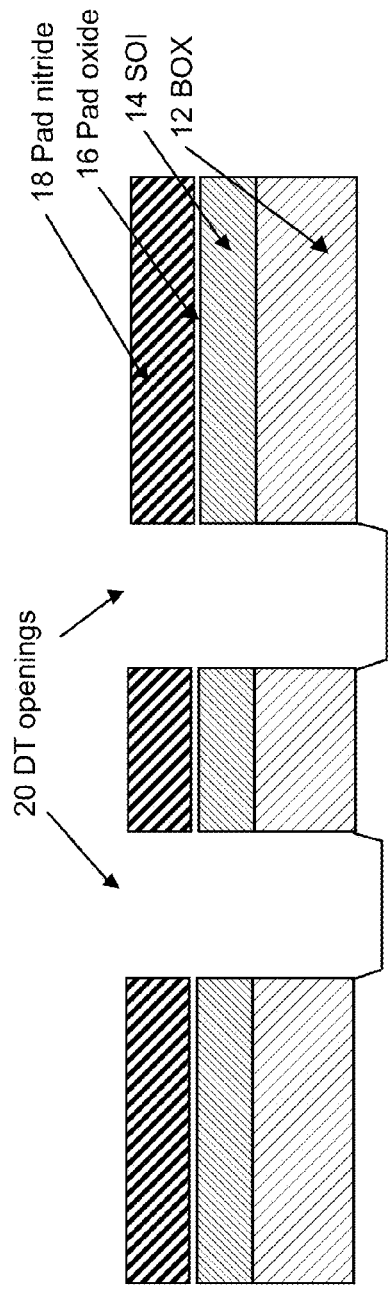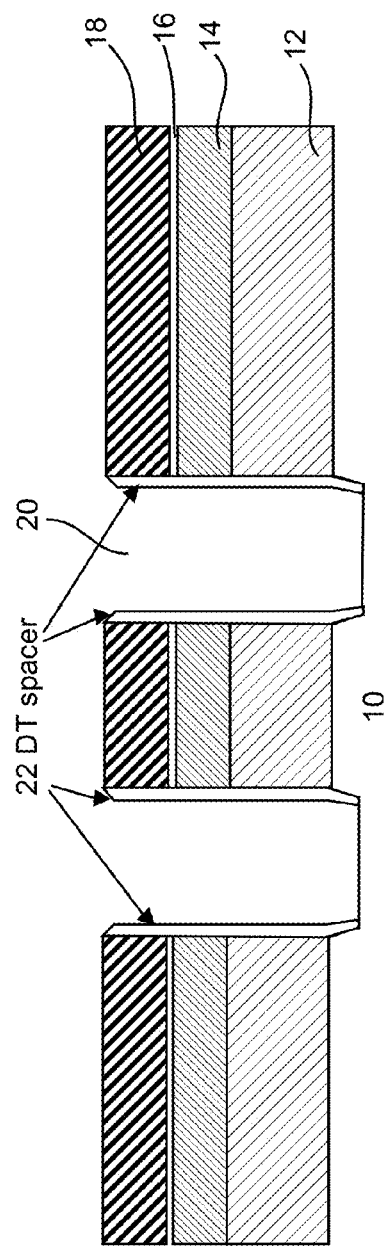

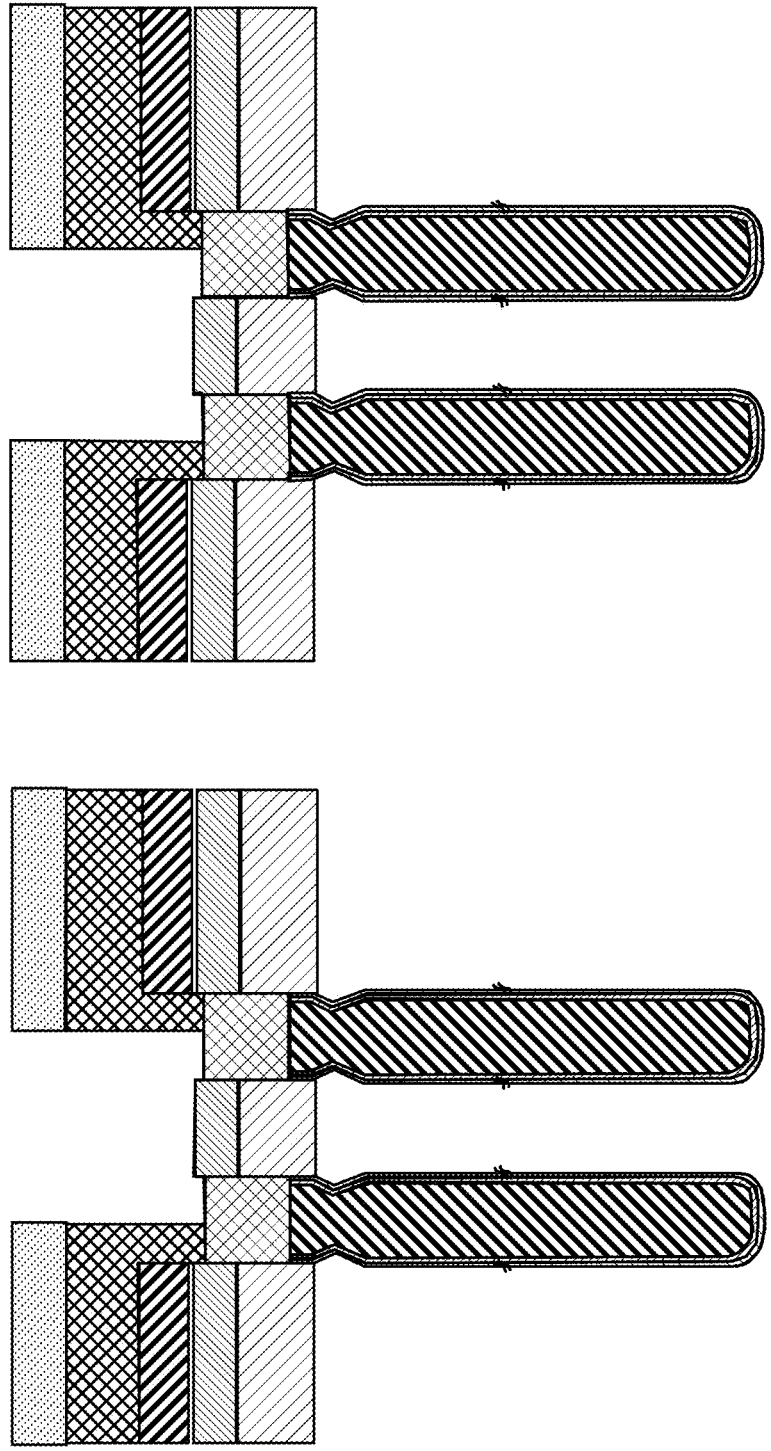

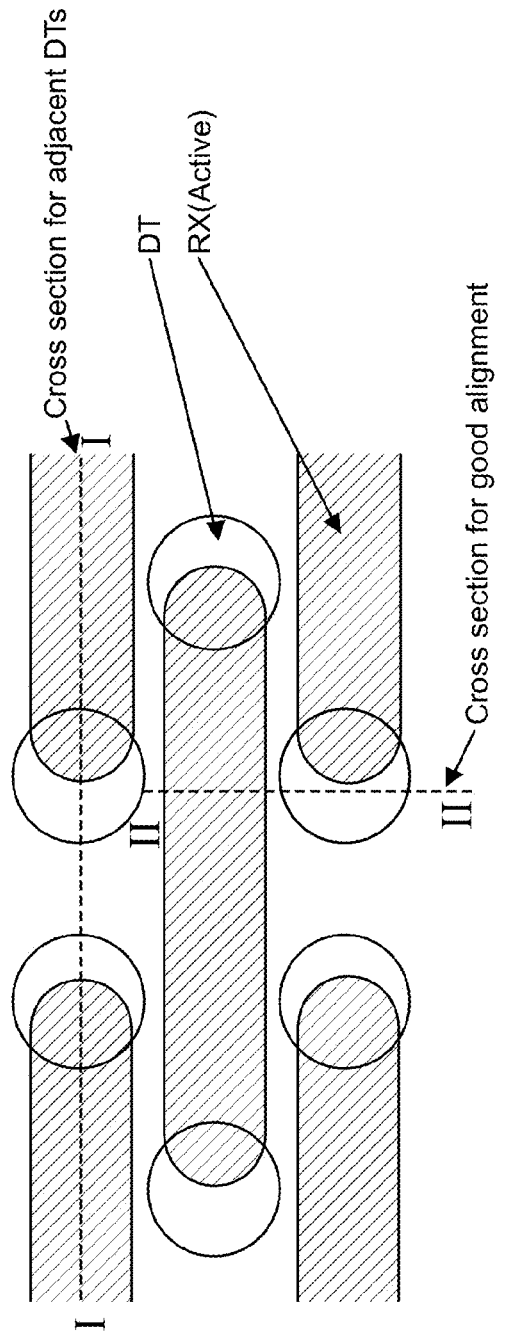
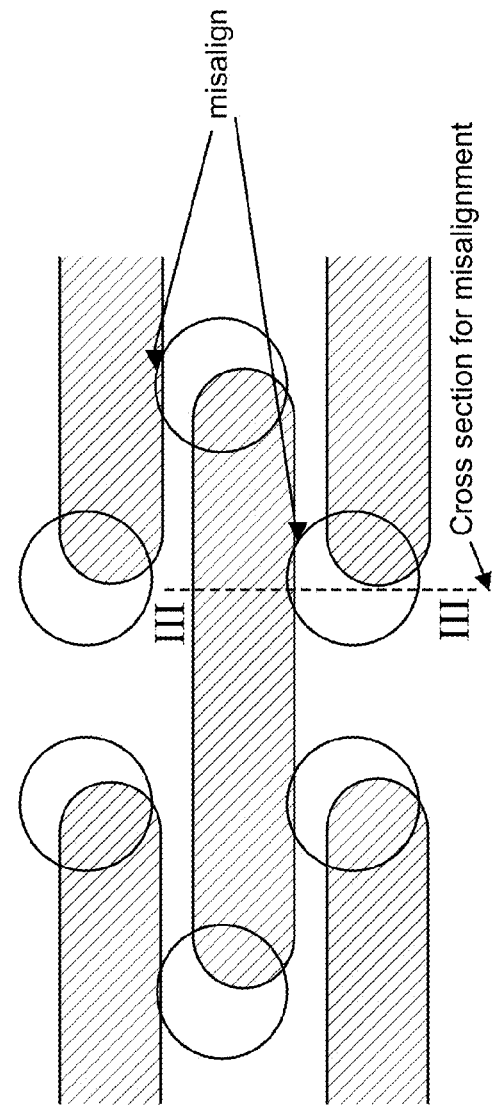
*Figure 18A*
*Figure 18B*

Mild OPL lateral etch

More OPL lateral etch

HIGH-K AND METAL FILLED TRENCH-TYPE EDRAM CAPACITOR WITH ELECTRODE DEPTH AND DIMENSION CONTROL

FIELD OF THE INVENTION

The present invention generally relates to storage capacitor structures for memory cells in semiconductor integrated circuits formed at high integration density and, more particularly, to high-K material and metal filled eDRAM capacitors formed at extremely high integration density and the increase of process windows and overlay tolerance during manufacture of such devices.

BACKGROUND OF THE INVENTION

Needs for increased functionality, capacity and performance of integrated circuits of a given chip size and increased economy of manufacture have driven the size of electronic elements thereof to extremely small sizes and extremely high integration densities. Small size of active and passive electrical components allows increased integration density and increased numbers of electrical devices on a chip of given area for increased functionality. High integration density allows interconnections to be of reduced length which supports higher clock rates of operation while reducing susceptibility to noise. However, such small sizes and high numbers of electronic elements has greatly increased the accuracy with which such elements must be formed. For example, it is known that tools such as process chambers for integrated circuit manufacture are not precisely uniform over the entire processing area of a wafer and allow small variations in the rate at which various processes such as etching are performed across the area of a semiconductor wafer from which many concurrently formed chips are later diced. Further, deposition and etching processes are known to be affected by chip design since differing densities of elements and areas for deposition and etching can locally concentrate and/or deplete etchant or material precursor concentrations. Both of these effects are becoming significant at current and foreseeable integration densities and electronic element sizes. At the present state of the lithographic art for semiconductor manufacture, variations in structures due to such non-uniformity of the progress of material deposition and removal processes can cause defects of sufficient severity to significantly reduce manufacturing yield.

While all types of semiconductor devices are potentially subject to such problems, high density memory arrays and processors having embedded memory arrays are particularly subject to the occurrence of such defects and consequent loss of manufacturing yield. This susceptibility to loss of manufacturing yield is principally due to the need for maximum possible memory capacity requiring extremely high density of capacitors formed at or near the limits of lithographic resolution which also contributes to lack of process uniformity across the chip and wafer areas. Deep trench storage capacitors which include a dielectric material having a particularly high dielectric constant to increase capacitance and which are metal filled for high write, erase, sense and refresh speeds have been found to be particularly susceptible to such defects and compromise of manufacturing yield. It has also been recently observed that such storage capacitor structures are particularly sensitive to overlay errors, especially when forming connections between electrodes when the deep trench capacitors are optimally nested for extreme integration density.

SUMMARY OF THE INVENTION

It is therefore an object of the present invention to provide a method and structure for improving uniformity of material removal processes during manufacture of semiconductor integrated circuits.

It is another object of the present invention to provide for uniformity of material removal processes using a structure and method that increases overlay error tolerance.

In order to accomplish these and other objects of the invention, a method of semiconductor device manufacture is provided comprising steps of forming an aperture in a layer of material extending over other material, applying an organic planarizing layer (OPL) over a surface of the integrated circuit and within the apertures, partially removing the OPL within the apertures to form OPL plugs in the apertures, performing material removal steps around the apertures or OPL plugs, removing the OPL plugs, and performing additional processes on the electronic element.

In accordance with another aspect of the invention, a method of semiconductor device manufacture is provided comprising steps of forming an aperture in a layer of material extending over other material, applying an organic planarizing layer (OPL) over a surface of the integrated circuit and within the apertures, partially removing the OPL within the apertures, removing the OPL material within the apertures, the step of removing OPL material including lateral etching of OPL material and other exposed material in the aperture, and performing additional processes on the electronic element.

In accordance with a further aspect of the invention, a semiconductor wafer is provided including an electronic element formed below a surface of a substrate or layer of semiconductor material, and a conductive body of material formed within an aperture and in contact with the electronic element wherein the conductive body of material is recessed substantially uniformly at all locations on the semiconductor wafer.

In accordance with yet another aspect of the invention, a semiconductor device is provided including two electronic elements formed below a surface of a substrate or layer of semiconductor material, two conductive bodies of material formed within respective apertures and in contact with respective ones of the two electronic elements, and a strap connection connecting the two conductive bodies wherein a width of the strap connection corresponds to a degree of overlay error in the location of the strap connection relative to the two conductive bodies.

BRIEF DESCRIPTION OF THE DRAWINGS

The foregoing and other objects, aspects and advantages will be better understood from the following detailed description of a preferred embodiment of the invention with reference to the drawings, in which:

FIGS. 1, 2, 3, 4, 5 and 6 are cross-sectional views illustrating basic steps in the formation of deep trench (DT) Hi-K and metal filled capacitors for which the invention is particularly well-suited, FIGS. 11, 12A, 12B, 13A, 13B, 14A, 14B, 15A, 15B, 16A and 16B are cross-sectional views illustrating manufacture of a DT capacitor in accordance with the invention, FIG. 17 comprises scanning electron microscope images of cross-section of DT capacitors illustrating the effectiveness of the invention to solve problems caused by etching non-uniformity, FIGS. 18A and 18B illustrate, in plan view, an exemplary misalignment overlay error as well as indicating the locations of cross-sectional view shown in other Figures.

DETAILED DESCRIPTION OF A PREFERRED EMBODIMENT OF THE INVENTION

Figure 3:
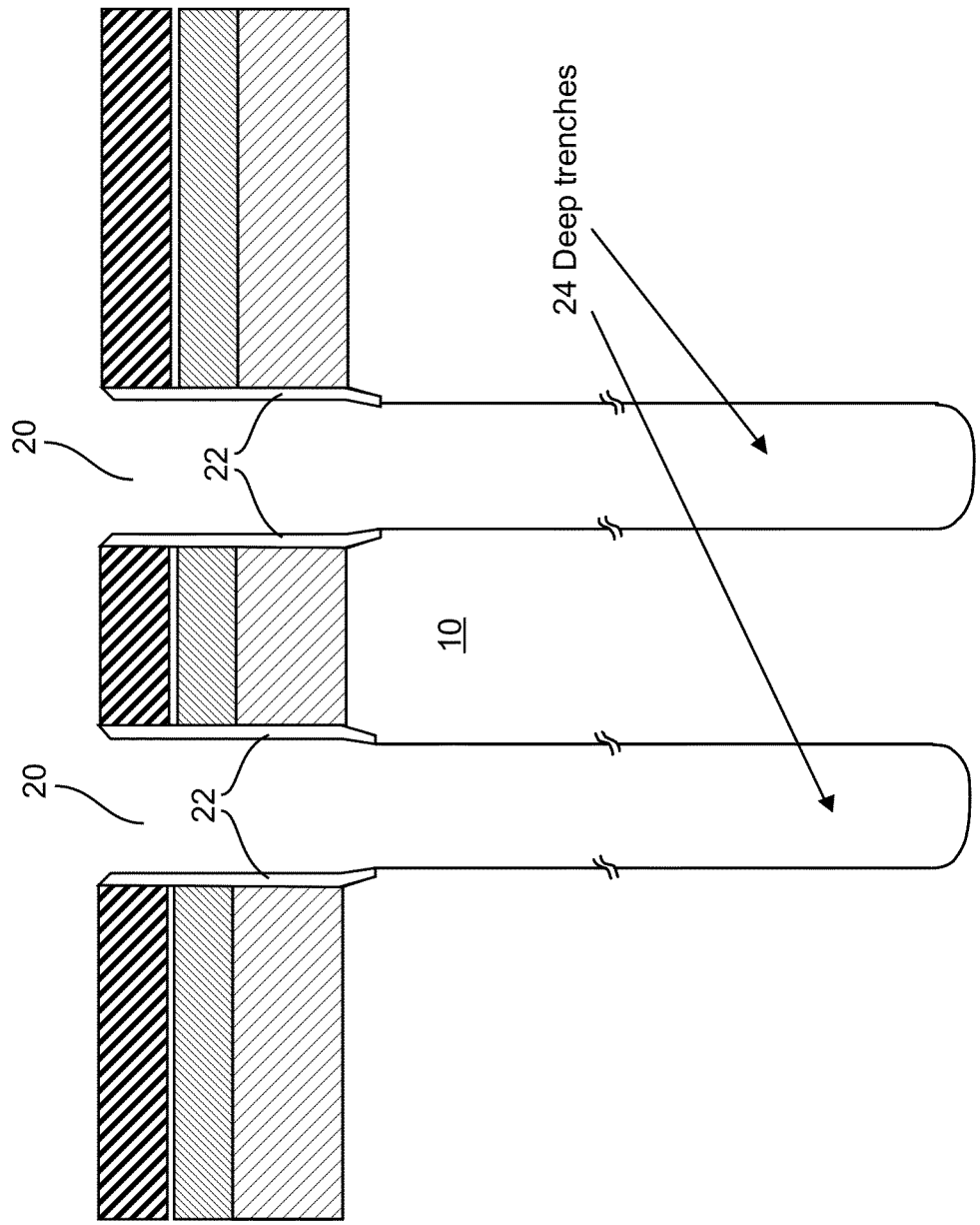
Figure 4:
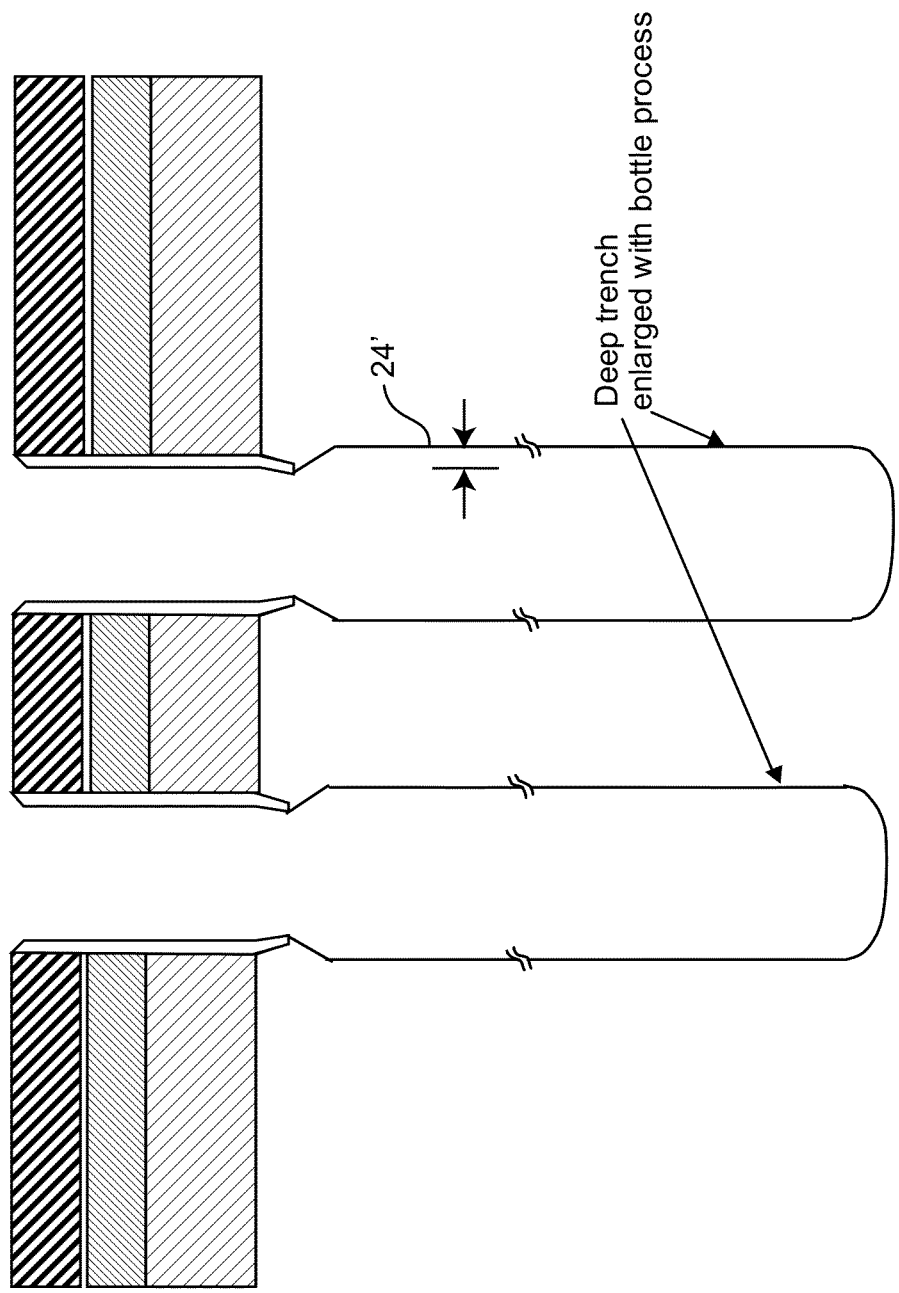

Referring now to the drawings, and more particularly to FIG. 1, there is shown, in cross-section, an initial stage in manufacture of deep trench (DT), Hi-K and metal filled capacitors. It should be understood that while the manufacturing stages illustrated are generalized and arranged to convey a basic understanding of the manufacturing process which gives rise to the problems addressed by the invention and the invention is not depicted therein, no portion of any of FIGS. 1-6 is admitted to be prior art in regard to the present invention. These Figures will therefore be designated "Related Art". By the same token, while manufacturing processes will be explained in regard to use of a semiconductor-on-insulator (SOI) substrate or wafer having a silicon active layer, as is preferred, the invention may be successfully practiced to obtain its meritorious effects with any substrate or wafer of any structure and having an active layer and handling substrate of any semiconductor material and an insulator layer of any electrically insulating material on which a high quality semiconductor active layer can be developed. The cross-sections shown in FIGS. 1-6 are taken along dashed line I-I of the plan view illustrated in FIG. 18A.

As illustrated in FIG. 1, the preferred SOI wafer comprises a handling substrate 10, so-called since it principally provides mechanical robustness to the wafer and the thin insulator layer 12 (sometimes referred to as a buried oxide or BOX layer, regardless of actual composition) and thin semiconductor layer 14 formed thereon, also provides a conductive common electrode for an array of deep-trench (DT) capacitors to be formed therein. At he stage of capacitor production illustrated in FIG. 1, a thin pad oxide layer 16 and pad nitride layer 18 have been formed over the active semiconductor (e.g. silicon) layer 14. The combination of pad oxide 16 and pad nitride 18 can be etched selectively to each other and, when patterned (e.g. using a resist layer, not shown that can be selectively exposed to energy which develops differential solubility to form a pattern), provides a hard mask for etching of the semiconductor layer 14, the insulator later 12 and the handling substrate 10. This etching process should be substantially anisotropic (for which many suitable processes are known) to form openings 20 without significant etching of the ends of layers 12 and 14 as they are exposed and should extend only slightly into the handling substrate 10 so that a DT spacer 22 formed of any material that will withstand the further etching of the handling substrate 10 will fully cover the ends of the semiconductor and insulator layers 12, 14 exposed within the trench as illustrated in FIG. 2.

Figure 5:
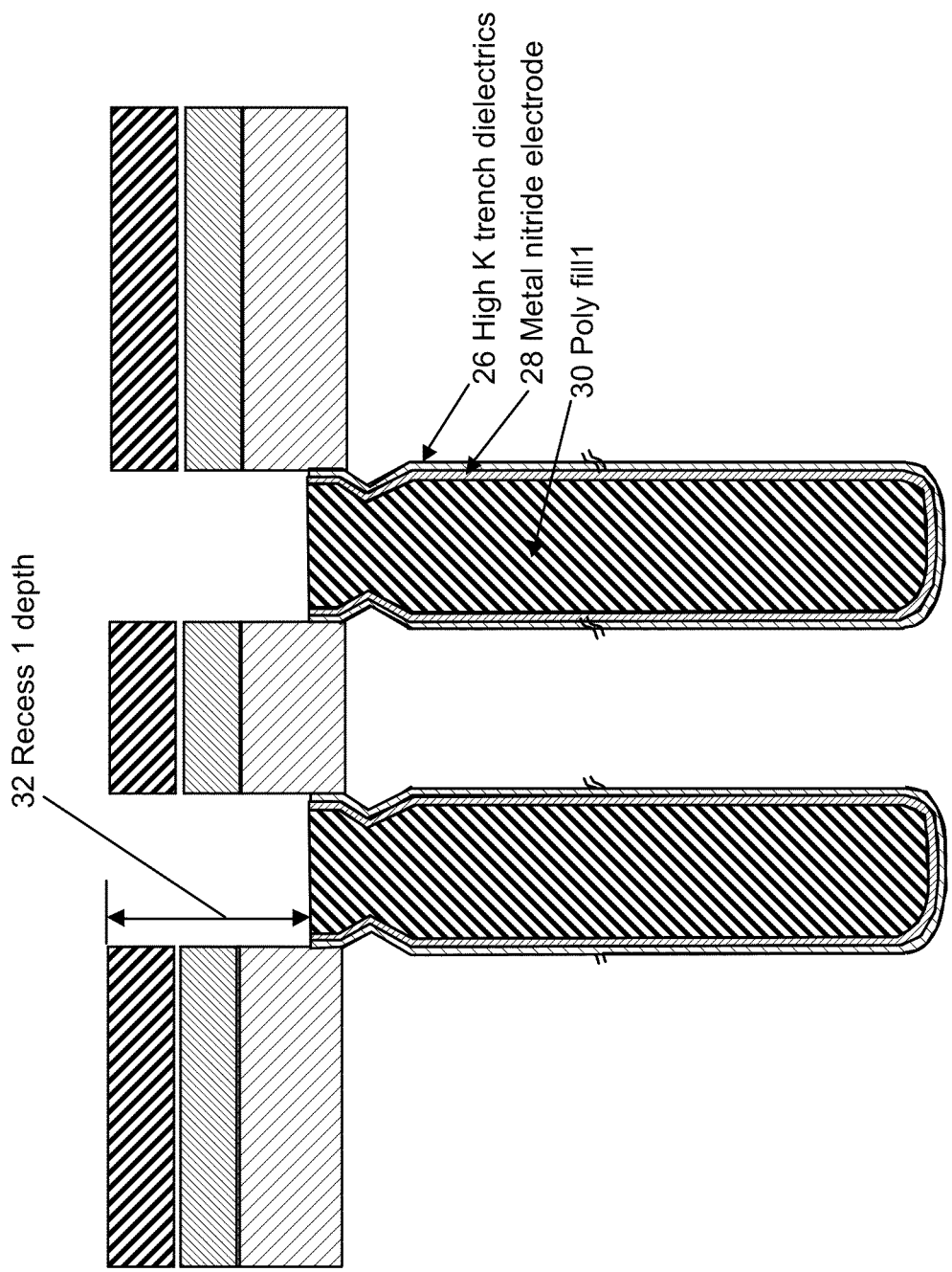

Then, as shown in FIG. 3, deep trenches 24 are etched, preferably using a substantially anisotropic etching process for which many suitable processes are well-known. To further increase the area of the interior of the deep trenches, an isotropic etch, for which many suitable processes are known, is then performed within the deep trenches, as shown at 24' of FIG. 4. The process of enlarging the deep trenches in such a manner is referred to as bottling since it forms a bottle-like shape that is larger in diameter than at opening 20. Then, as shown in FIG. 5, the enlarged deep trenches 24' are lined with an isotropically deposited Hi-K dielectric layer 26 and a conductive metal or metal nitride layer 28. The remainder of the deep trench 24' is then filled with conductive polysilicon 30 which is then recessed (including the upper edges of the Hi-K material 26 and conductive metal nitride 28 liners) to a point within the thickness of insulator layer 12, referred to hereinafter as recess 1. Then, to make a connection to the metal or metal nitride liner 28 and polysilicon fill 30, additional doped polysilicon 34 is deposited and recessed (36) to a point within the active semiconductor layer 14, referred to hereinafter as recess 2. The doped polysilicon improves conductivity of the contact but principally serves to protect the upper edges of the metal or metal nitride layer and Hi-K layer from oxidation or attack from other chemical processes. The thickness of additional doped polysilicon also serves to reduce criticality of etch rates of additional etching processes that will be performed later but a thickness to fully protect against defects from such a variation in etch rates cannot, as a practical matter, be provided. This above-described process substantially completes the DT capacitor structure, which is often referred to as a storage node, although significant additional processing will be required to form connections to doped polysilicon contacts 34.

Referring now to FIGS. 7-10B, a problem that arises from non-uniformity of etching during such additional processing, referred to as active layer lithography in which portions of active semiconductor layer 14 are selectively removed prior to connection formation but to which a solution is provided by the invention will now be explained. As alluded to above, all reaction vessels for performing semiconductor processing will exhibit some degree of non-uniformity of the rate at which material deposition or removal will occur due to slight variations in temperature, material flow rate and the like. A similar effect is also observed due to differences in the ratio of the area on which material is selectively deposited or the area from which it is being removed to the area of a portion of the wafer surface that causes local variation of the concentration of reactants near the surface where deposition or etching is being performed. For example, if a large fraction of a particular area is being etched, there will be a higher percentage of etched material and a reduced concentration of etchant near the wafer surface as reaction products of the etching process are produced than if a smaller fraction of a similar area is being etched. Therefore, etching will proceed more rapidly in areas where the change in concentration of reaction products is smaller. Since many etching processes cannot be controlled by using layers of selectively etchable material as an etch stop for the process, such processes are performed as timed etches where an etch rate is assumed from empirical data. The time required to remove a particular amount or thickness of material can then be computed. However, since the entirety of the thickness of a layer of material must generally be removed, the required time must be computed in regard to the lowest anticipated etch rate for any area on the wafer and, as a consequence, any variation in etch rate will be a more rapid etch rate as is assumed in the illustrations of FIGS. 8A-10B; the Figures designated as "A" illustrating the results of a timed etch assuming the lowest anticipated etch rate as nominal and the Figures designated "B" illustrating the results of an etch process for the same length of time but which proceeds at a rate which is above the lowest anticipated or nominal etch rate. Again, these Figures are generalized and arranged to convey an understanding of the problems addressed by the invention and no portion of any of FIGS. 7-10B is admitted to be prior art in regard to the present invention. As above, since the invention is not illustrated in these Figures, they have been designated as "Related Art".

Figure 6:
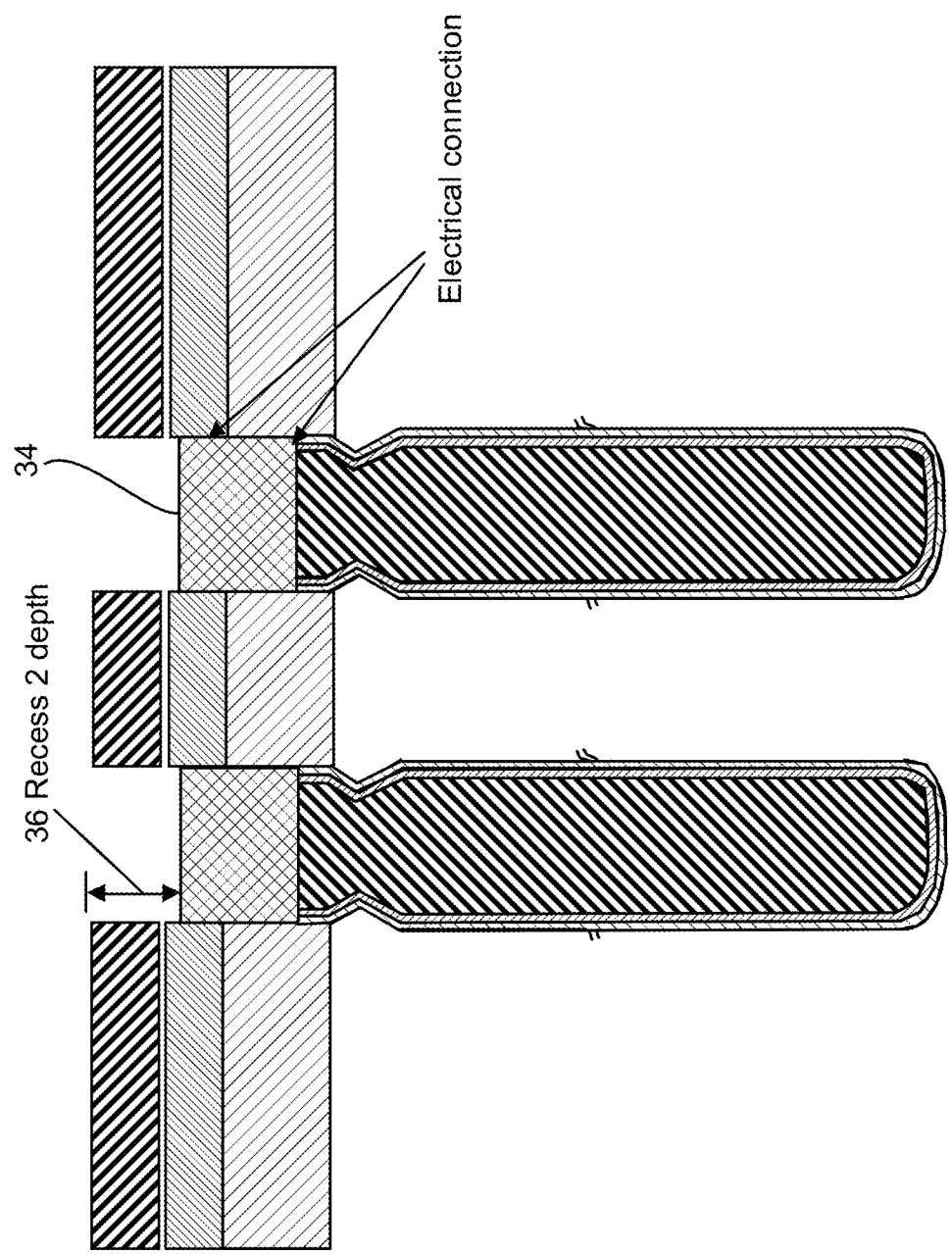
Figure 7:
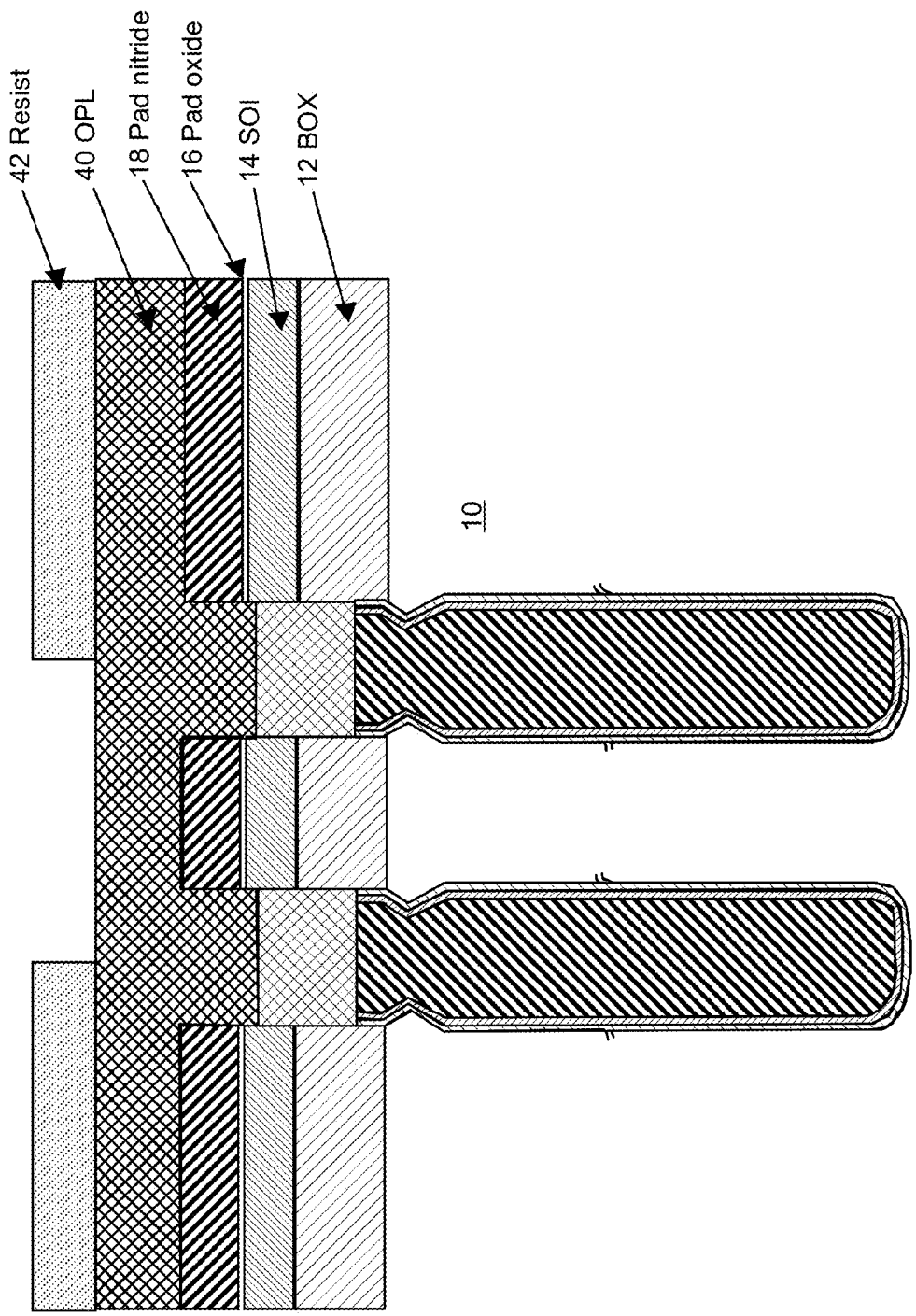
FIGS. 7, 8A, 8B, 9A, 9B, 10A and 10B are cross-sectional views illustrating the problem of lack of etch uniformity addressed by the invention.
Figure 8B:
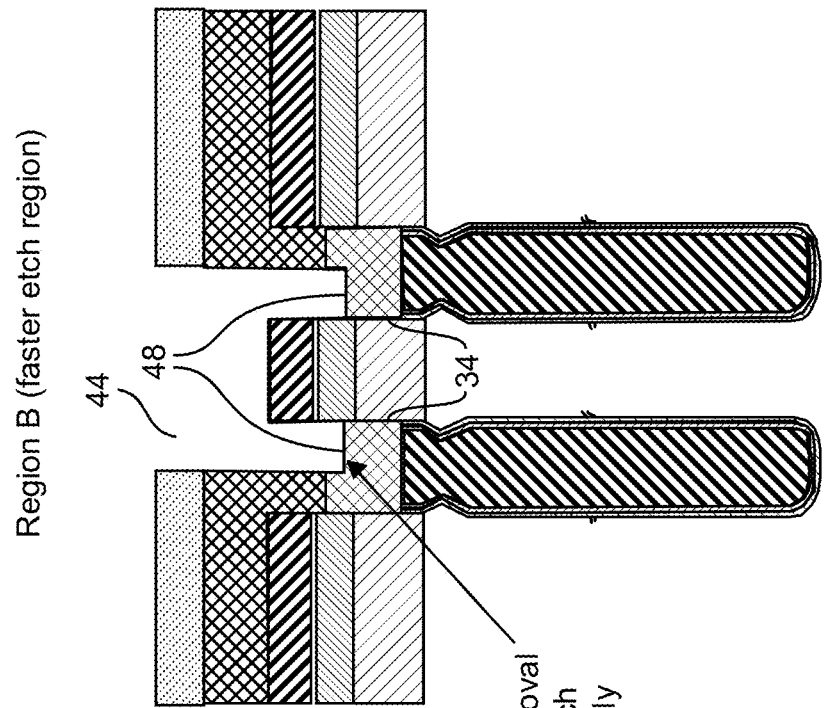
Figure 8A:
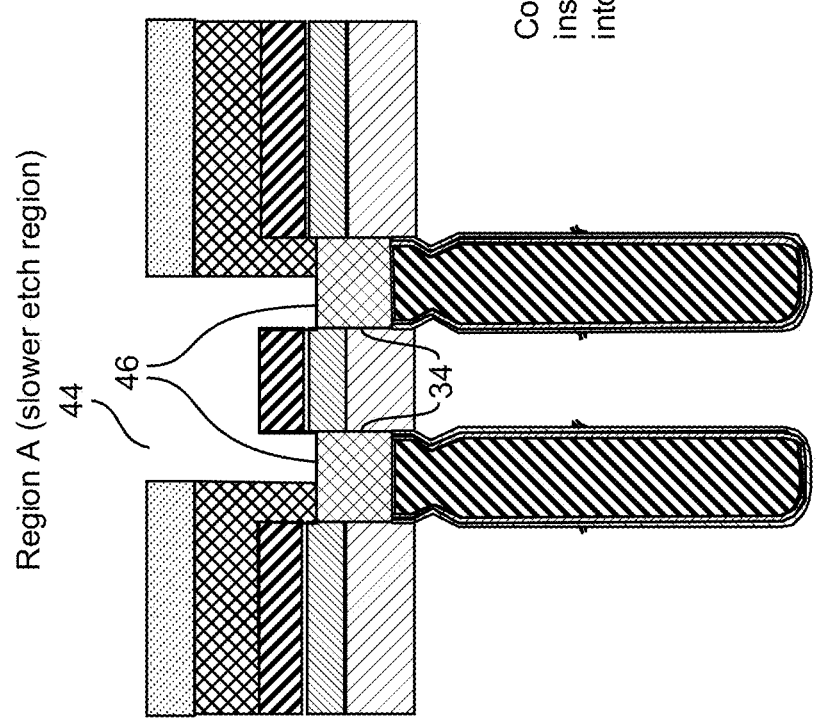

FIG. 7 shows essentially the same structure as shown in FIG. 6 produced by the generalized method discussed above. However, an organic planarizing layer (OPL) 40 has been applied, followed by a resist layer 42 which has been patterned. Numerous OPL materials are known which are suitable for the practice of the invention. OPL materials can be etched selectively to most other materials of interest for manufacture of semiconductor devices and, since they are similar in composition and optical properties to photo resists, can be removed easily. It should be noted that the OPL layer 40 fills recess 2 (36) and produces a planar top surface that facilitates exposure of resist 42 which will have a similarly planar surface. FIGS. 8A and 8B show the result of etching OPL layer 40 in accordance with the pattern/opening in resist layer 42 to form opening(s) 44. This etching process is timed to completely remove the OPL material in opening 44 to the surface of the pad nitride 18 and the surface of the doped polysilicon fill 34 as shown at 46 of FIG. 8A. However, where the etch proceeds more rapidly, the etching process attacks the polysilicon fill 34 and removes some of that material below the surface of recess 2 as shown at 48 of FIG. 8B.

Figure 9B:
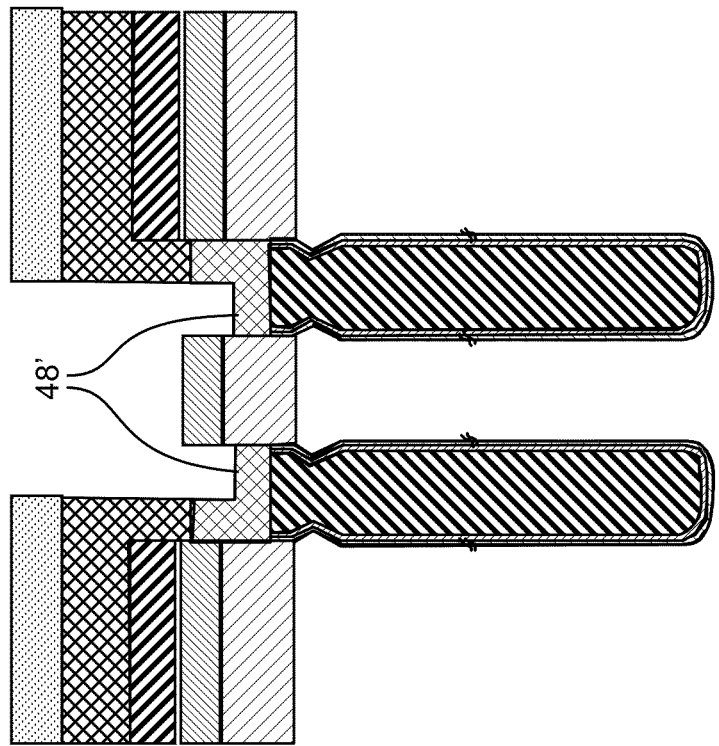
Figure 9A:
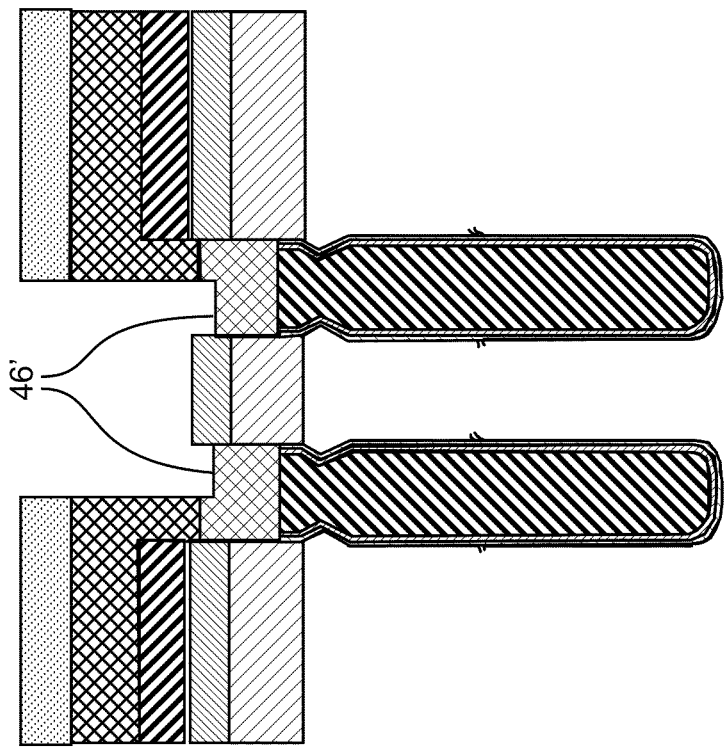
Figure 10B:
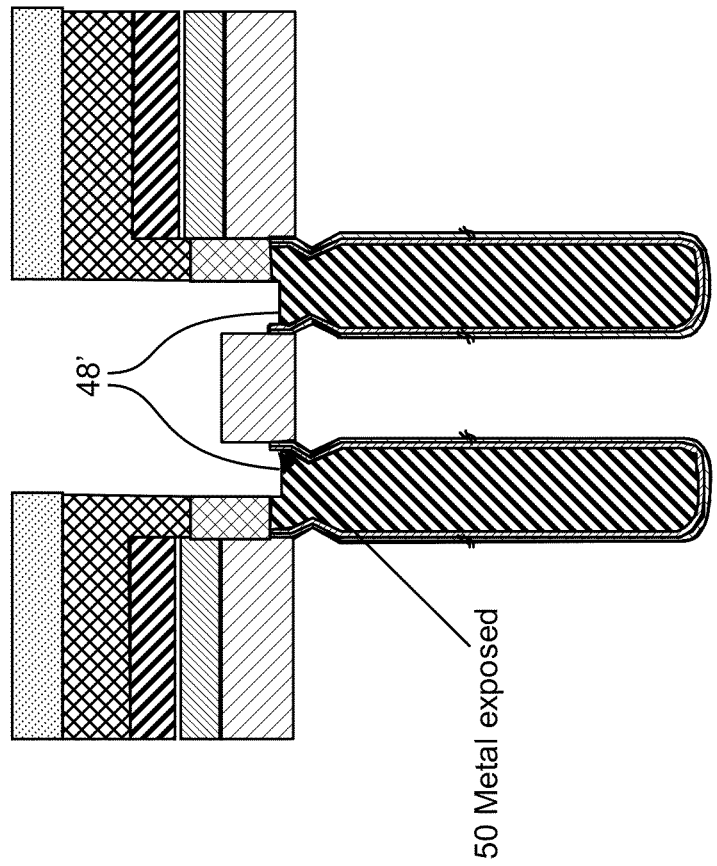
Figure 10A:
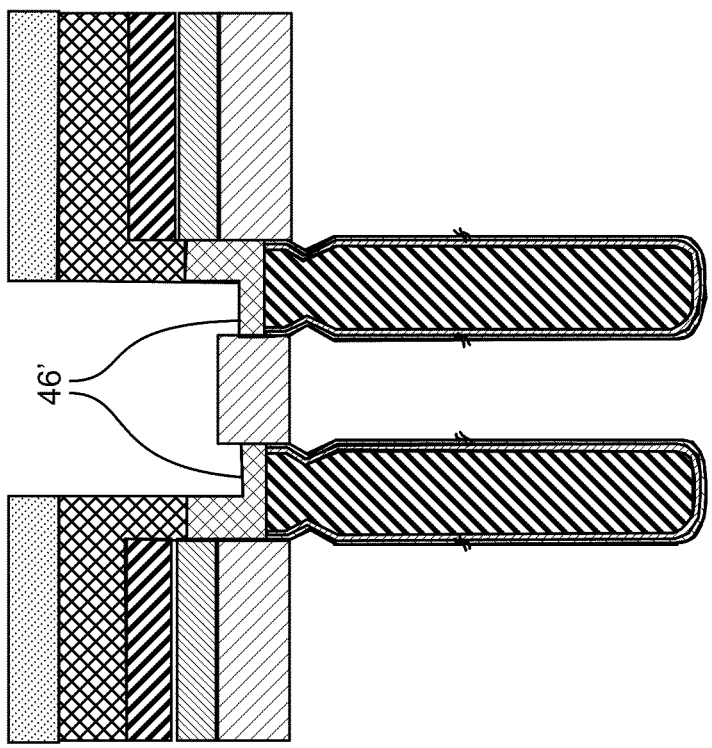

To eventually form a strap connection between the doped polysilicon regions as is generally desirable in capacitor memories of this type, the remaining pad oxide layer 16 and the semiconductor layer 14 remaining from the etch of FIG. 2, discussed above, must also be similarly removed using selective etching. As shown in FIGS. 9A and 10A, these etching processes will necessarily also attack the doped polysilicon fill 34 as shown, for example, at 46' of FIG. 9A. However, it will be recalled from the foregoing that the actual etch rate will have contributions from both non-uniformities of operation of the reaction vessel and the layout of the integrated circuit design, itself. Therefore, the regions that exhibit an increased etch rate will be the same as for the pad nitride layer etch described above although the relative increase of etch rate may differ somewhat. Therefore, there will be additional excess etching of the polysilicon fill 34 during both the oxide and active silicon layer etching processes as shown at 48' in FIGS. 9B and 10B. As shown at 48' of FIG. 10B the excess etching reaches and further recesses a portion of the first polysilicon fill 30 (e.g. beyond the surface created by the first recess) and exposes the edge of the metal or metal nitride and Hi-K material layers 28 and 26, leading to the possibility of corrosion or other damage that is undesirable for semiconductor manufacturing. That is, further etching can occur since strong acids such as hydrofluoric acid or sulfuric acid may be present and can also cause oxidation. Oxidized metal or metal nitride is also of increased volume and can cause warping or cracking of the chip as well as preventing the metal or metal nitride from functioning as an electrode of the capacitor. Properties of the Hi-K material can also be significantly modified and compromised by only slight contamination with oxides or silicates causing reduction in capacitance and increase in leakage. Increased alignment error in later process steps with subsequent thermal processing caused by the oxidized metal or metal nitride can limit manufacturing yield or completely prevent further processing from being properly performed, resulting in complete loss of a wafer. Any such defect is necessarily adequately severe as to cause chip malfunction or at least a significant reduction in operating margins and has the potential for reducing manufacturing yield.

Figure 11:
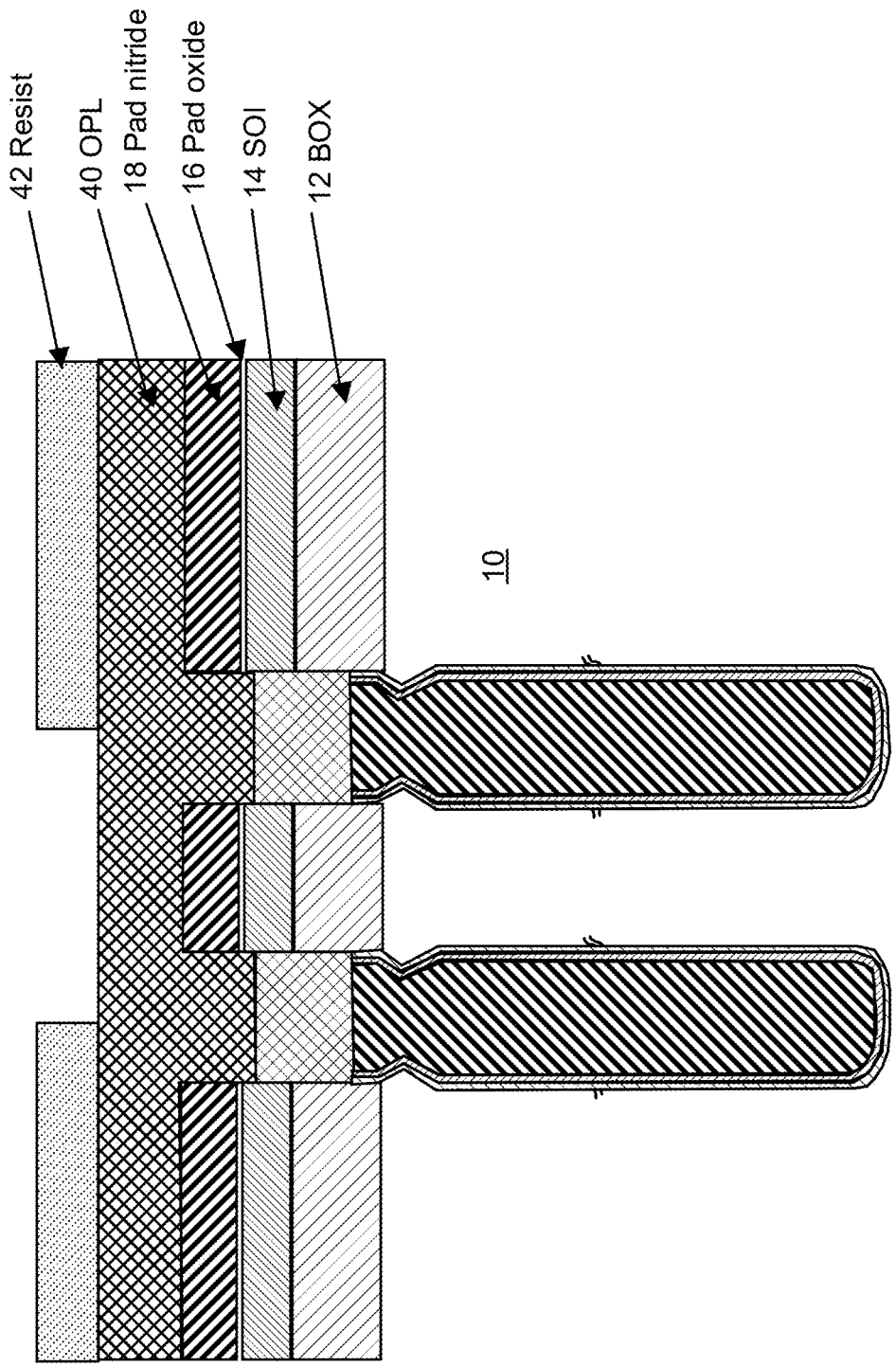
Figure 12B:
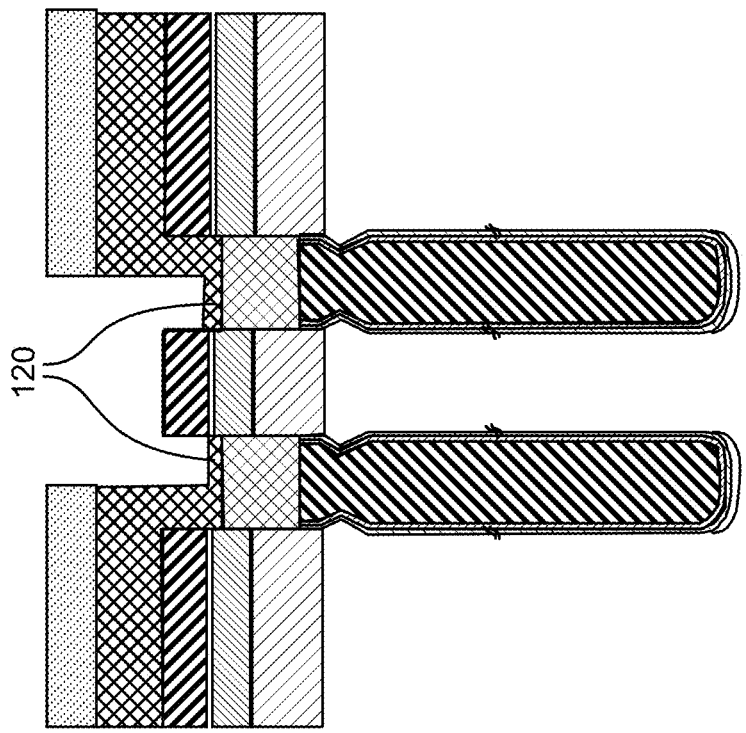
Figure 12A:
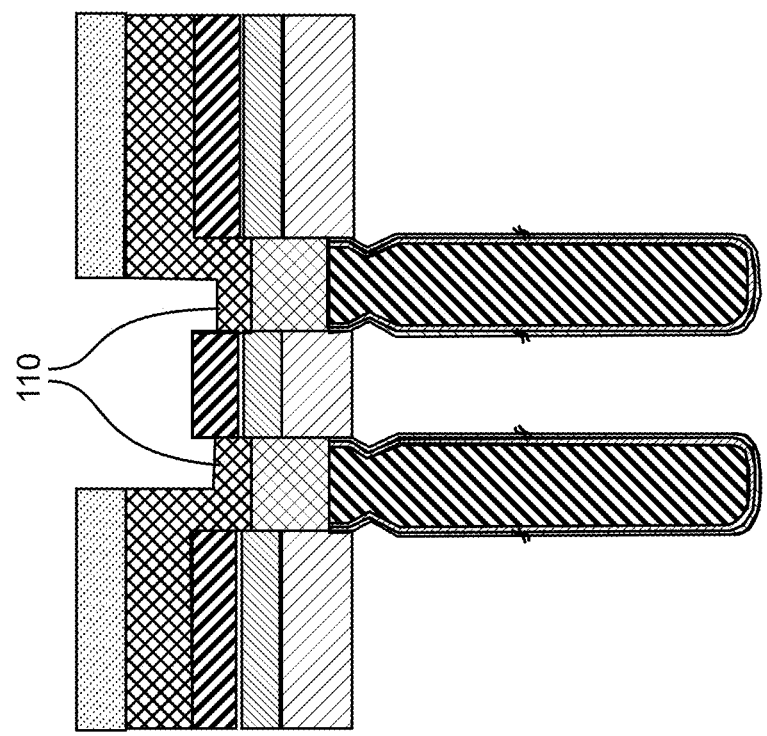
Figure 13B:
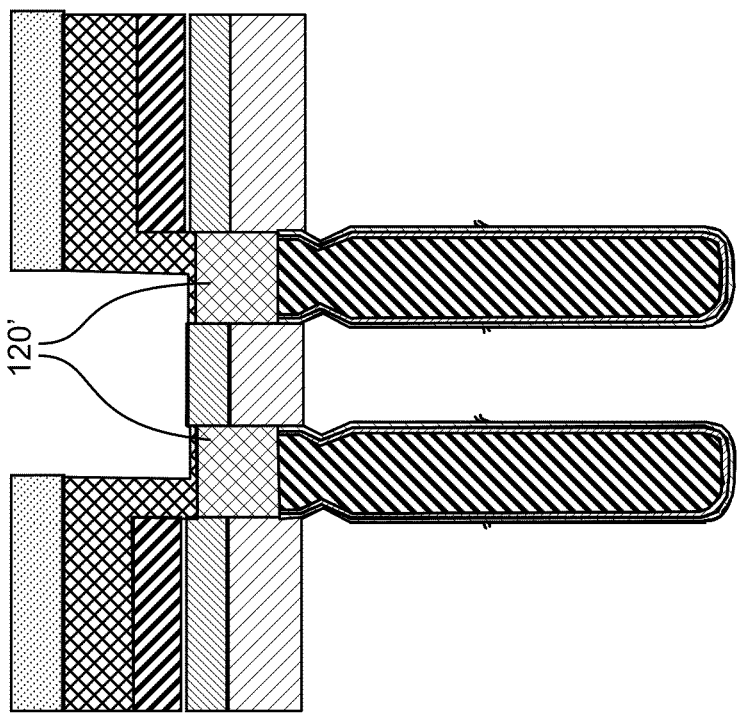
Figure 13A:
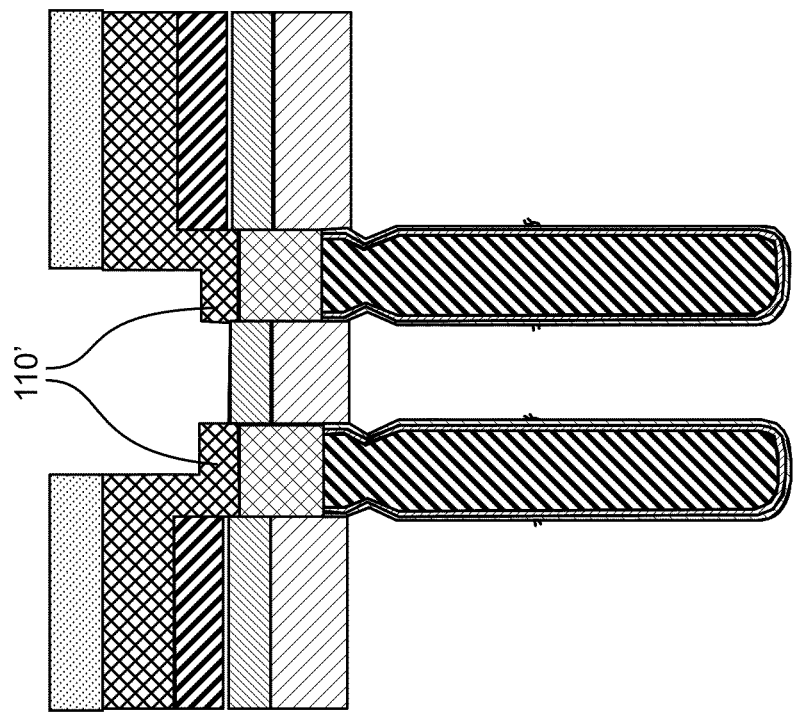

To avoid such a problem or other problems due to non-uniformity of material removal processes, the invention will now be explained with reference to FIGS. 11-16B. FIG. 11 is substantially identical to FIG. 7 with the OPL layer 40 and the patterned resist layer 42 in place on the structure developed in the process discussed above in connection with FIGS. 1-6, but is repeated here for purposes of continuity of the description of the invention. As shown in FIGS. 12A and 12B, the OPL layer is etched in accordance with the aperture/patterning of resist layer 42. However, in this case, in accordance with the invention, this etch of the OPL layer is a timed etch that is terminated above the doped polysilicon 34, leaving a plug 110 of OPL material above it. As shown in FIG. 12B, where the etch proceeds more rapidly, less OPL material remains, as shown at 120 of FIG. 12B but even the reduced thickness is effective to function as a plug. The pad nitride and pad oxide layer etches can then be performed as shown in FIGS. 13A and 13B which are relatively selective to the OPL although slight etching of the OPL material occurs and the OPL plug remains in place as shown at 110' of FIGS. 13A and 120' of FIG. 13B. Use of a combination of $CHF_3$ and $CF_4$ gas provides ample selectivity to carry out this etching process successfully and with substantial windows of process parameters such that the OPL plug remains intact even where an increased etch rate occurs. The pad oxide etch can then be similarly performed. It should also be noted that the OPL material in the opening as the OPL plug protects the polysilicon during the pad nitride and pad oxide etch although some etching of the OPL plug occurs. As a result, there is no polysilicon etch during this process and any non-uniformity of etching is effectively absorbed by the OPL plug which is later removed and uniformity of the location of the upper surface of the polysilicon 34 is greatly improved. The OPL plug can be removed prior to the active semiconductor layer etch as shown in FIGS. 14A and 14B. Sufficient selectivity between silicon (including the doped polysilicon fill 34, and OPL etching can be obtained using HBr, $O_2$ and $CO_2$ gas with $CO_2$ gas being a key component for high selectivity. As a result, the non-uniformity of OPL plug thickness does not transfer to etching of the polysilicon.

Figure 15B:
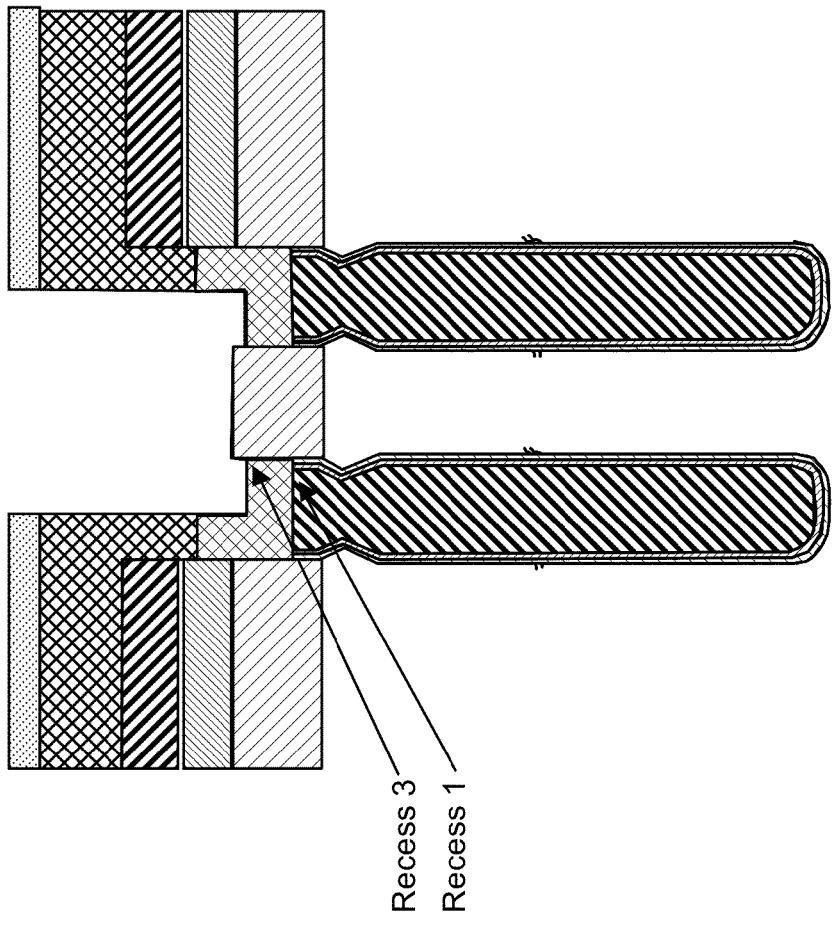
Figure 15A:
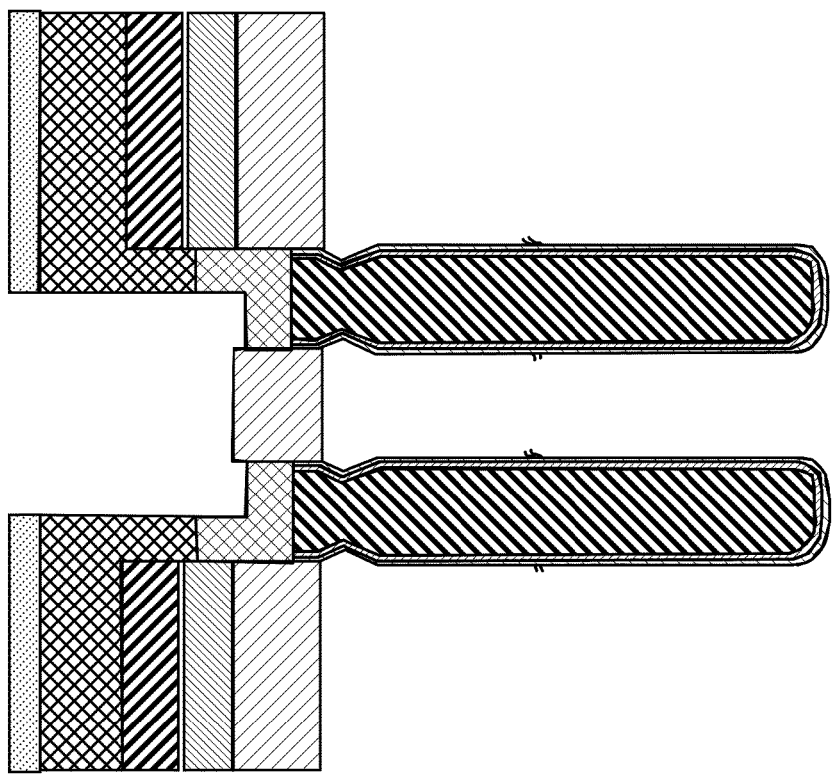
Figure 16B:
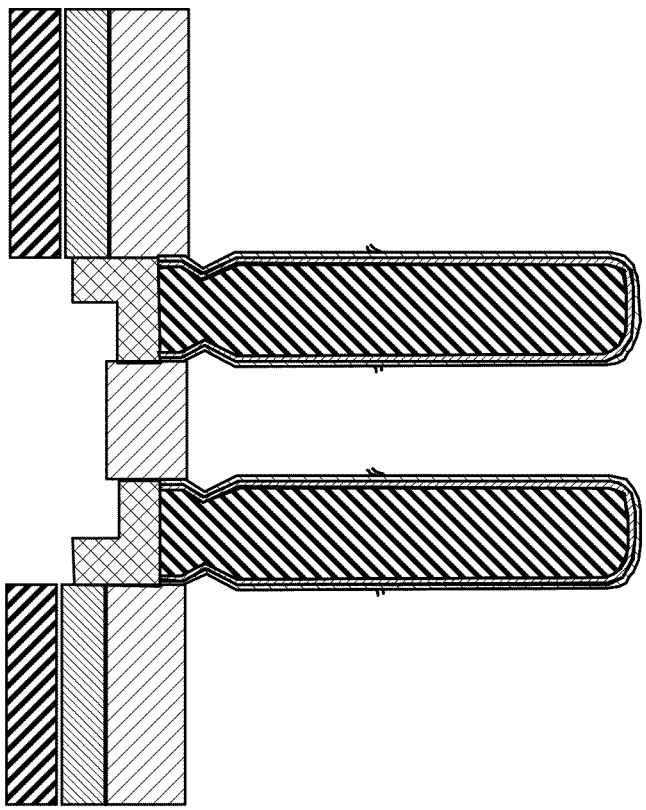
Figure 16A:
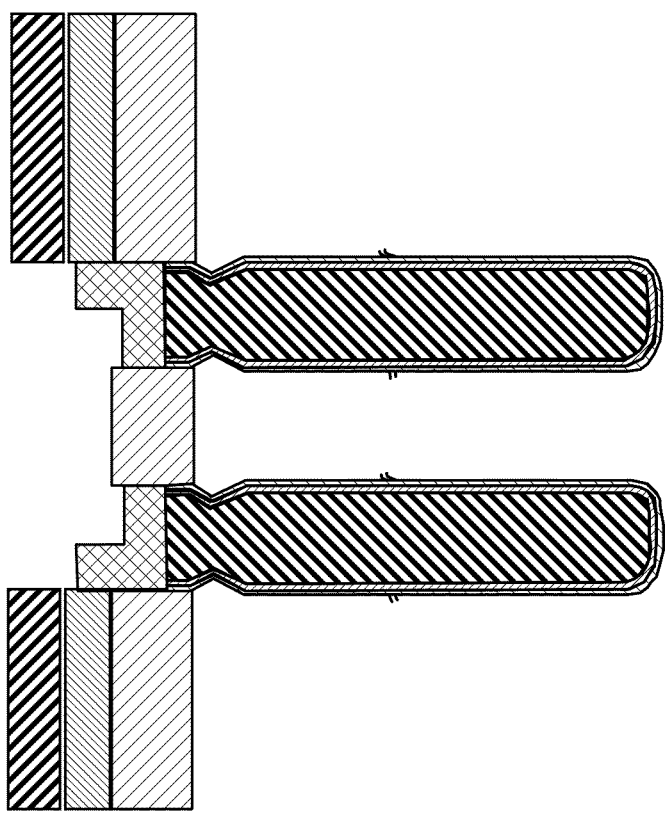
Figure 17:
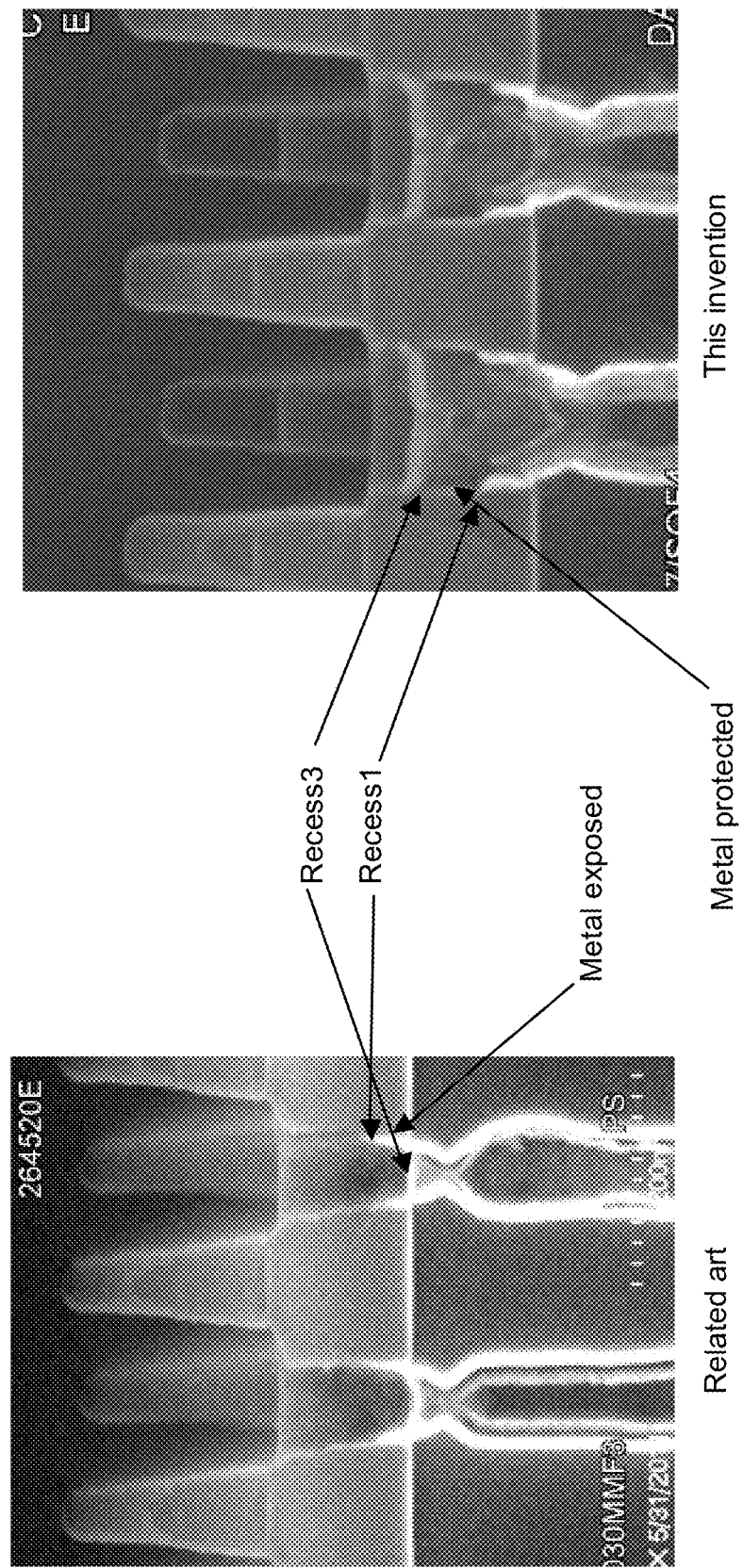

Then, as shown in FIGS. 15A and 15B the active silicon layer 14 and the DT recessed polysilicon are simultaneously etched. This process step in which silicon and polysilicon are etched together is the only process that affects polysilicon depth non-uniformity. This results in a recess of a portion of the doped polysilicon with better depth uniformity within the wafer as is desirable to form consistent strap connections across the wafer and with better quality Hi-K material and metal or metal nitride material. The resist and remainder of the OPL material can then be removed as illustrated in FIGS. 16A and 16B. It should be noted that the structures resulting in the OPL plug removal and all following steps are substantially identical regardless of differences in etch rates and that a substantial thickness of doped polysilicon remains above the metal or metal nitride electrode and Hi-K material which remains reliably protected throughout the process in accordance with the invention. This protection is particularly evident in the scanning electron microscope images corresponding to FIGS. 10B and 16A and B in FIG. 17.

Figures 18C, 18D:
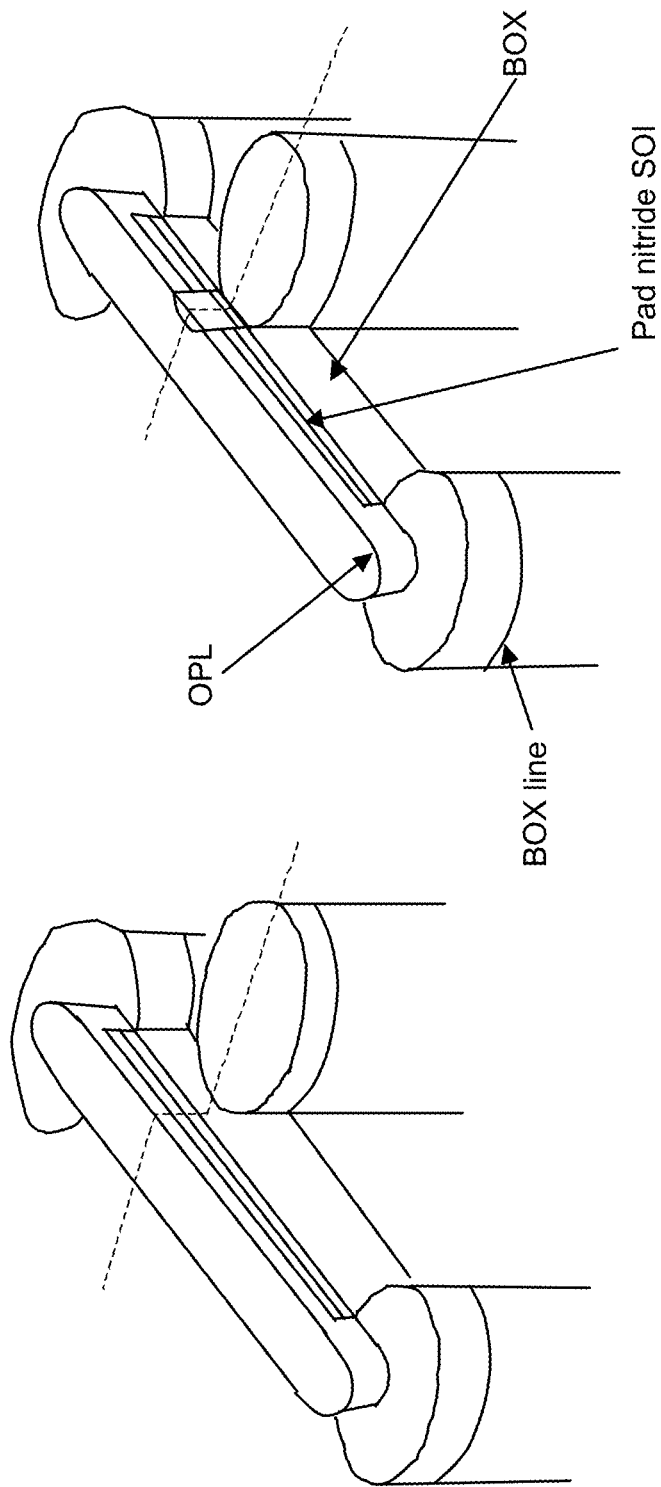
FIGS. 18C and 18D are isometric views showing a comparison of good alignment and misalignment of FIGS. 18A and 18B, respectively.

Referring now to FIGS. 18A-18B, a plan view of respective portions of a memory array is schematically illustrated. In FIG. 18A, DT capacitors are depicted in connection with the active layer which is a part of the strap connectors as described above properly aligned therewith. In FIG. 18B, the active layer and, hence, the strap connectors are misaligned by an overlay error shifting the connectors in the Y-direction. This misalignment, as illustrated, is sufficient to additionally overlie and connect with DT capacitor contacts of other storage nodes; effectively shorting the strap connectors to each other through the DT capacitor contacts and rendering the array inoperable. This undesirable connection can be more readily visualized from the isometric depictions of proper alignment and y-direction misalignment illustrated in FIGS. 18C and 18D, respectively. The structures which cause this defect will now be discussed in regard to FIGS. 19A-23B and the solution provided by the invention will be discussed in connection with FIGS. 24A-29B. As before, Figures having an "A" designation are cross-sections taken at section line II-II of FIG. 18A and have strap connections which are properly aligned while Figures having a "B" designation are cross-sections taken at section line III-III if FIG. 18B and illustrate results of overlay error misalignment. It should be noted that section lines II-II and III-III are orthogonal to section line I-I. Essentially, the OPL plug technique described above can be tuned to provide substantial overlay error tolerance.

Figure 19B:
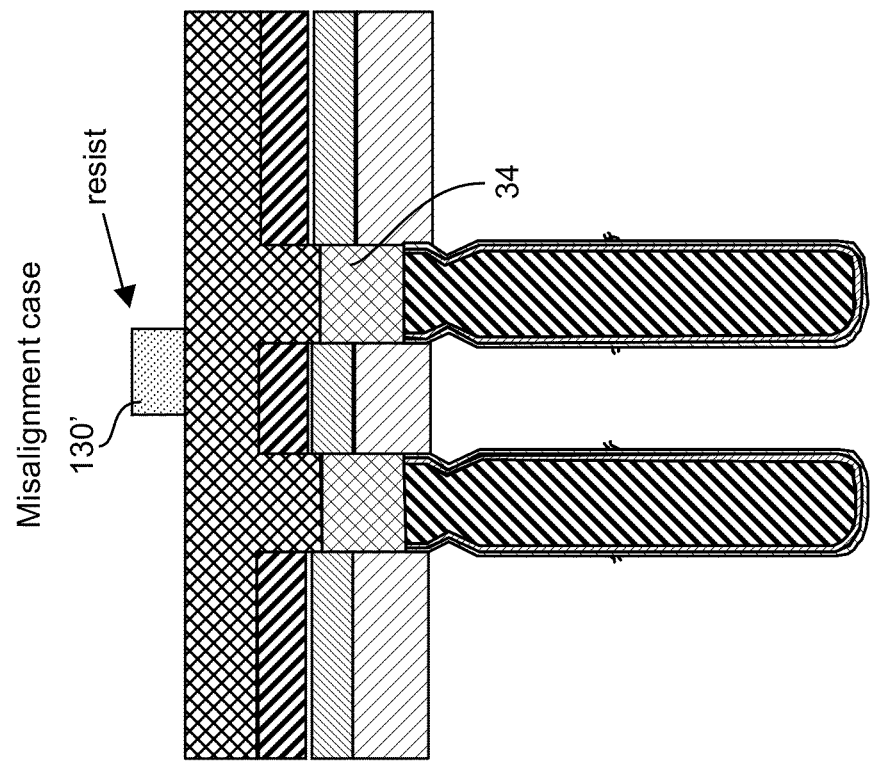
FIGS. 19A, 19B, 20A, 20B, 21A, 21B, 22A, 22B, 23A and 23B are cross-sectional views of DT capacitors illustrating an exemplary problem caused by the overlay error misalignment illustrated in FIG. 18B, FIGS. 24A, 24B, 25A, 25B, 26A, 26B, 27A, 27B, 28A, 28B, 29A and 29B are cross-sectional views illustrating avoidance of the exemplary problem of overlay error misalignment and the increase of overlay error tolerance in accordance with the invention.
Figure 19A:
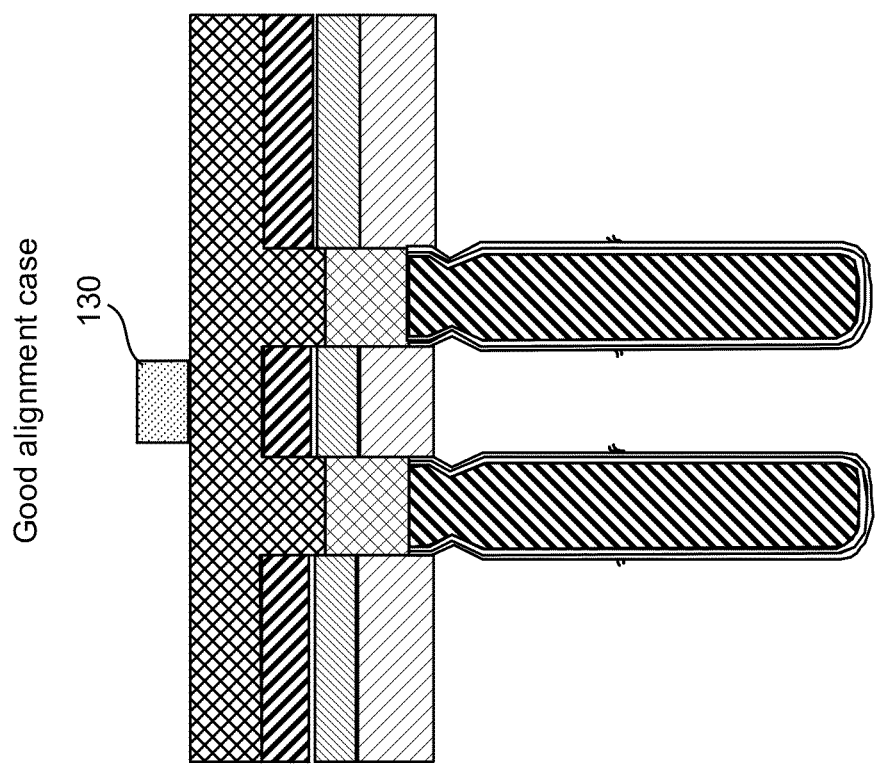

FIGS. 19A and 19B correspond to the structure shown in FIG. 7 or FIG. 11. However, the location of the patterned SOI, pad oxide, pad nitride and resist 130 and 130' do not correspond to these Figures since the section shown is different. That is, the sections shown in FIGS. 7 and 11 correspond to section line I-I of FIG. 18A while the section shown in FIGS. 19A and 19B correspond to section lines II-II in FIG. 18A and III-III in FIG. 18B, respectively. It should be noted that the strap connection connects storage node capacitors which are in front and back of the plane of the page and should not connect to either of the capacitors illustrated as may be best visualized From FIGS. 18C and 18D. Also, while a portion of the SOI layer was removed in the process described above, the portion shown in FIGS. 19A and 19B will be allowed to remain since it is a portion of the access transistor from the next row of DRAM cells and is evident from section line II-II of FIG. 18A.

Figure 20B:
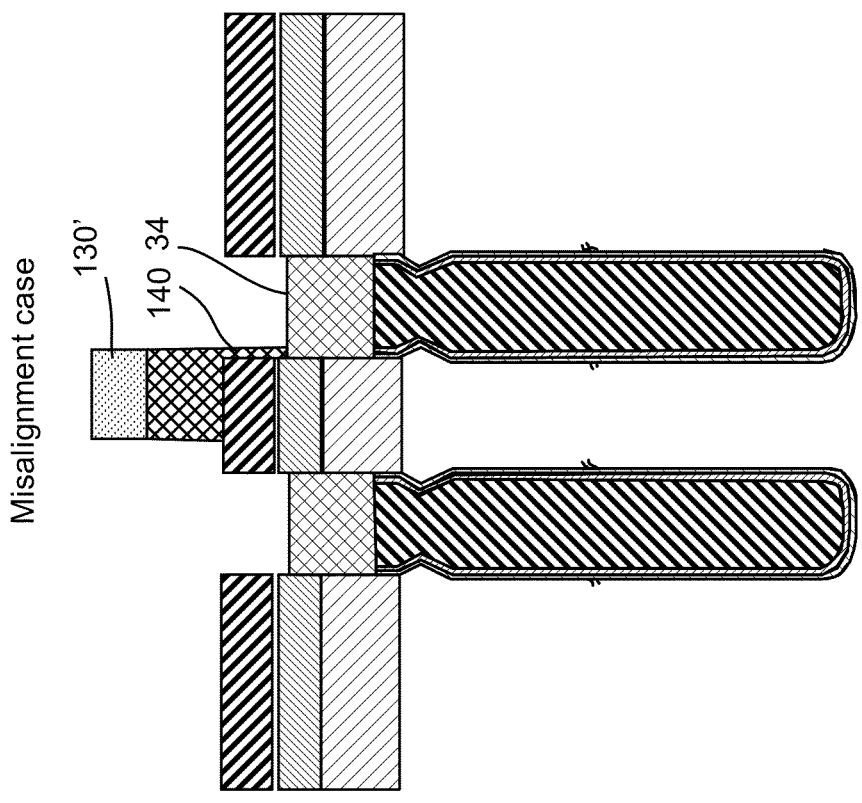
Figure 20A:
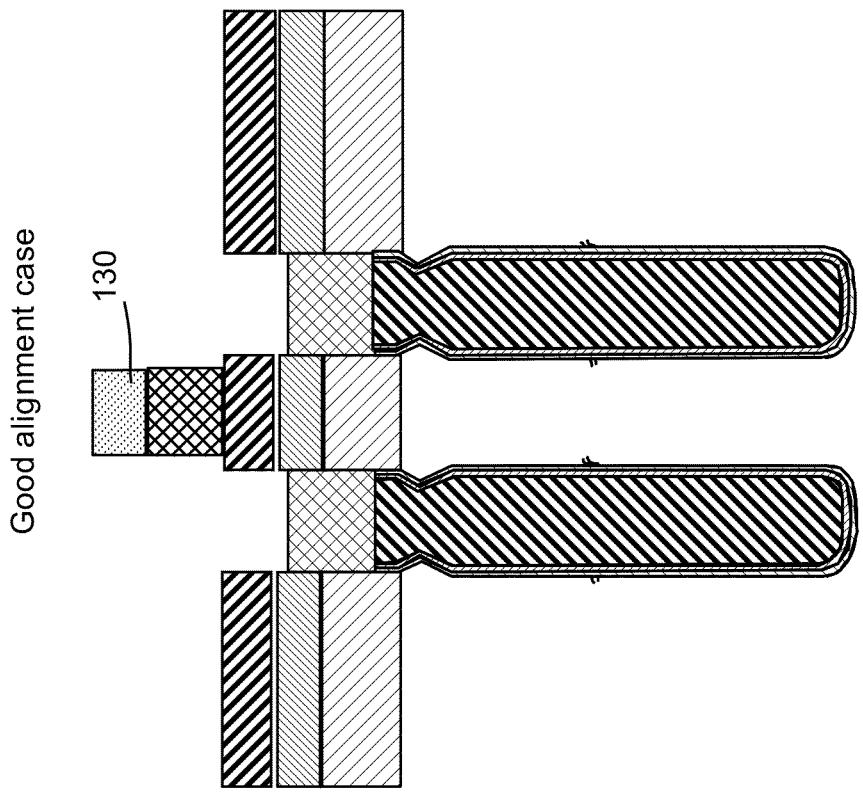
Figure 21B:
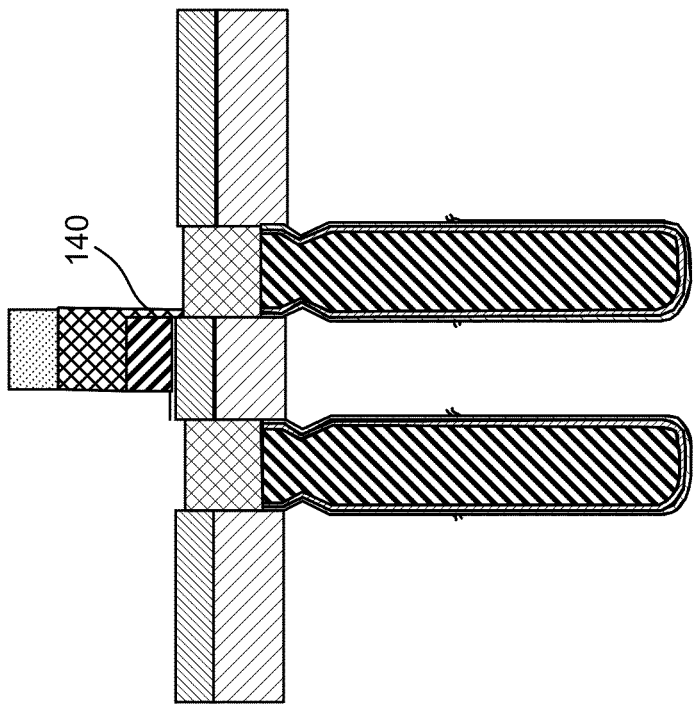
Figure 21A:
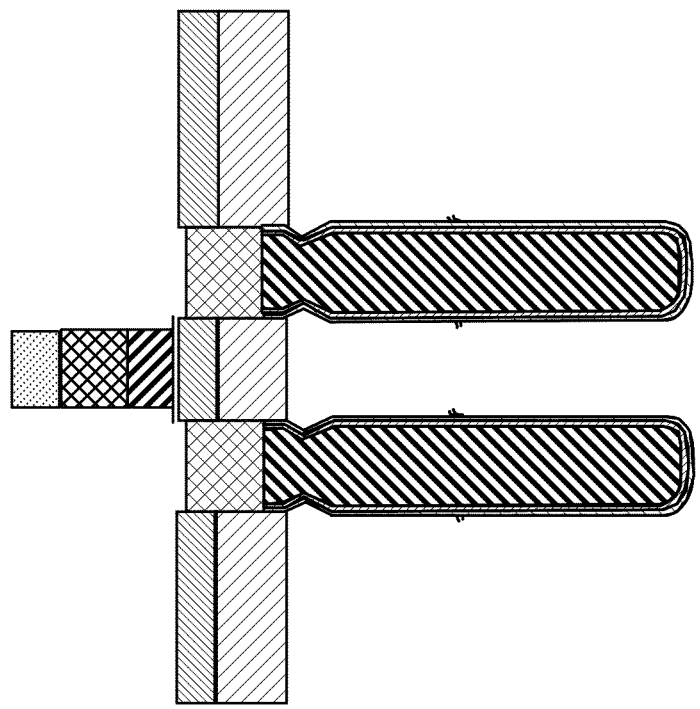
Figure 22B:
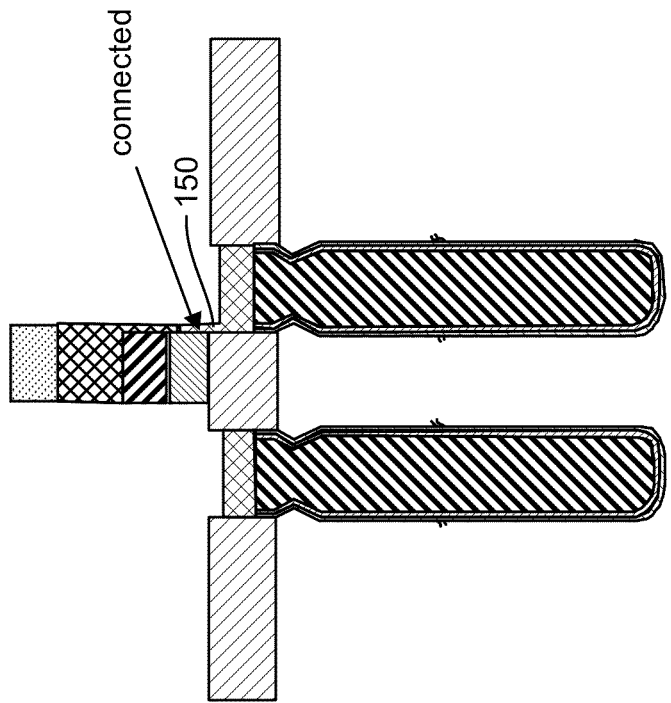
Figure 22A:
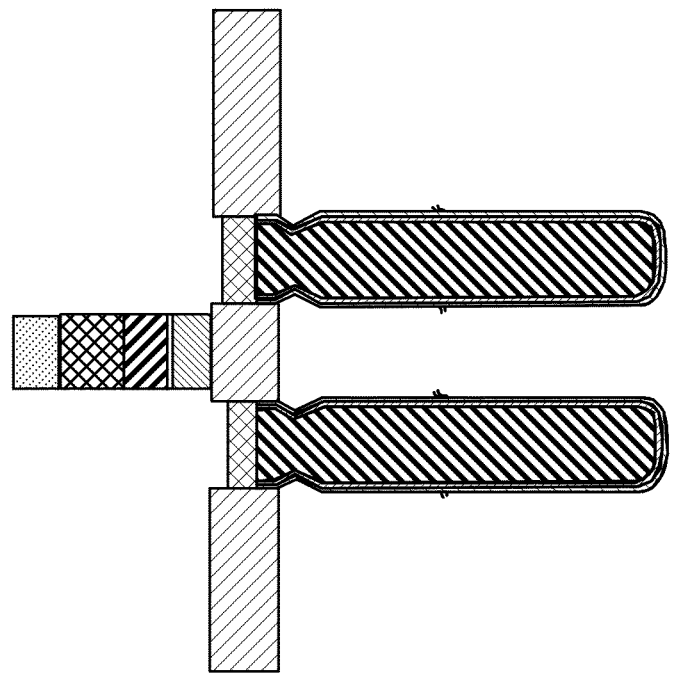
Figure 23B:
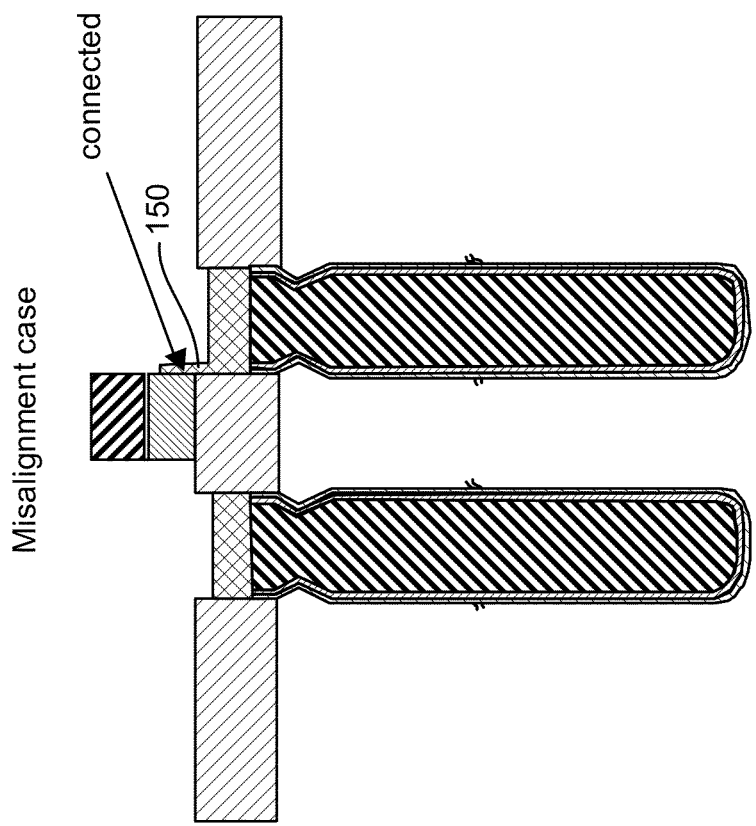
Figure 23A:
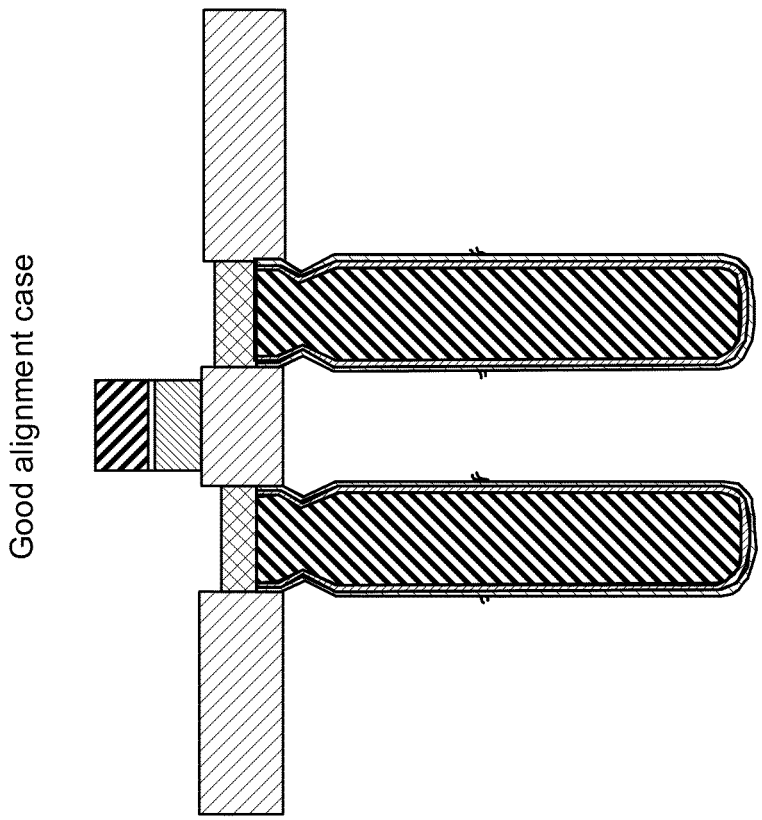

FIGS. 19A and 19B are identical to each other but for the location of resist 130' in FIG. 19B which is misaligned by overlay error such that a portion of the resist 130' overlies a portion of the doped polysilicon fill contact 34 whereas, in FIG. 19A, resist 130 is illustrated in the correct position between and not overlapping either of storage nodes illustrated. When the OPL material etch is performed, a portion of the OPL material remains above the doped polysilicon fill 34 as shown in FIG. 20B whereas no OPL remains in that area when the resist is properly aligned as shown in FIG. 20A. Subsequently, when the pad nitride is etched as shown in FIGS. 21A and 21B, this portion of the OPL material remains. Then, when the SOI and doped polysilicon 34 is etched, the remaining OPL material acts as a mask to prevent etching of a portion of the doped polysilicon fill 34; leaving a connection to the remaining portion of the SOI layer that forms part of the access transistor and resulting in a parasitic connection between the storage node and the access transistor of the next row, as shown in FIGS. 22B and 23B, rendering the memory inoperable, whereas no such connection remains in the properly aligned structure of FIGS. 22A and 23A.

Figure 24B:
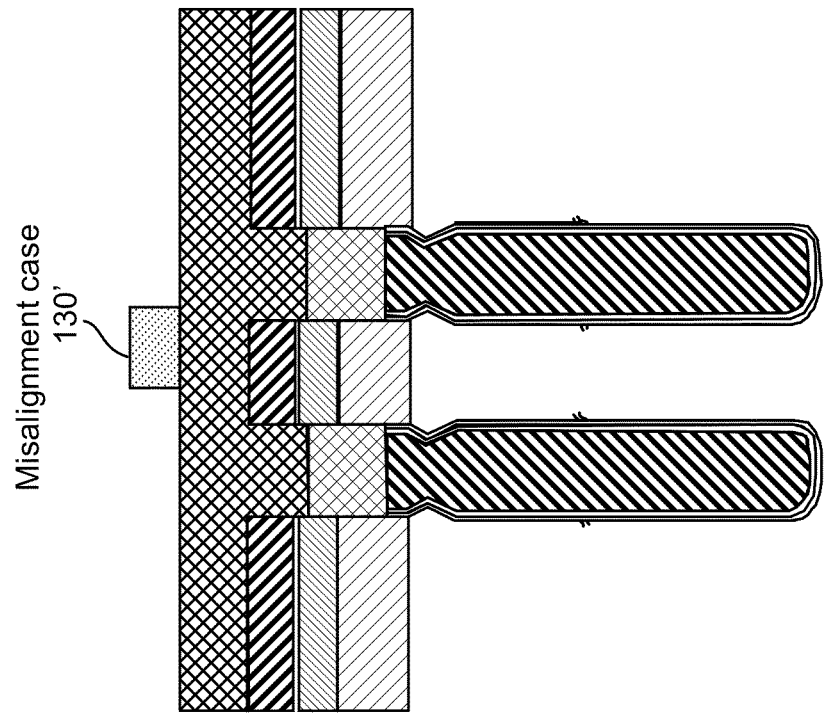
Figure 24A:
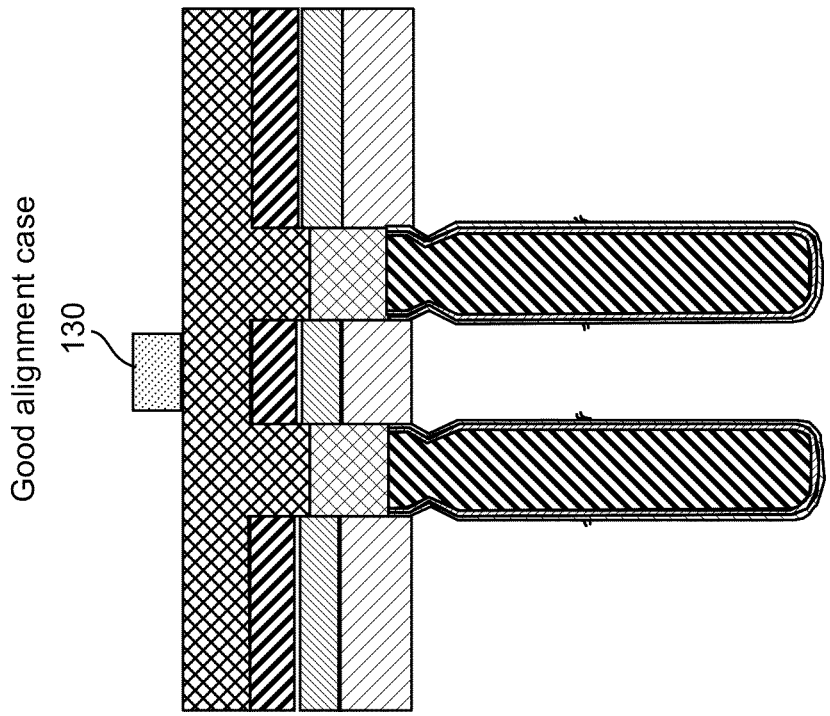
Figure 25B:
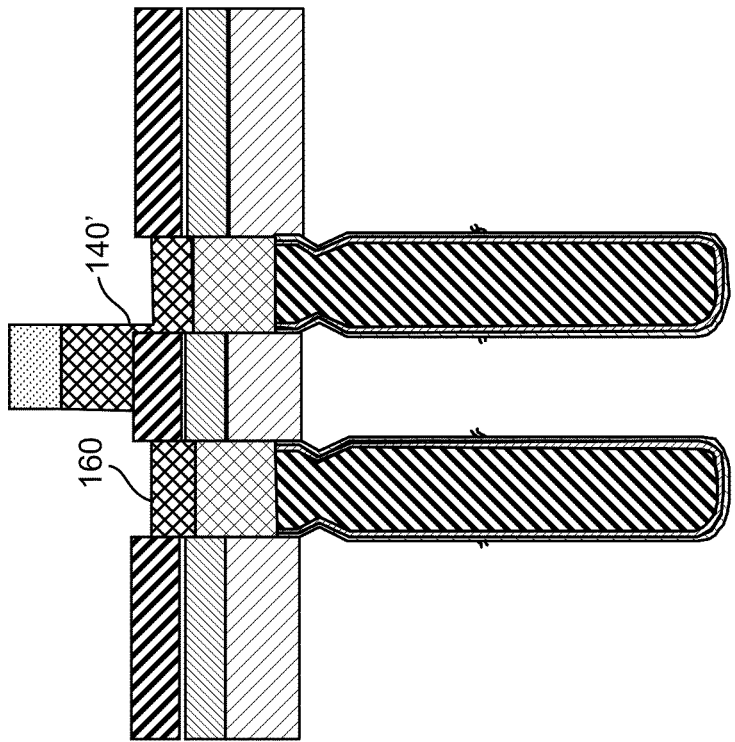
Figure 25A:
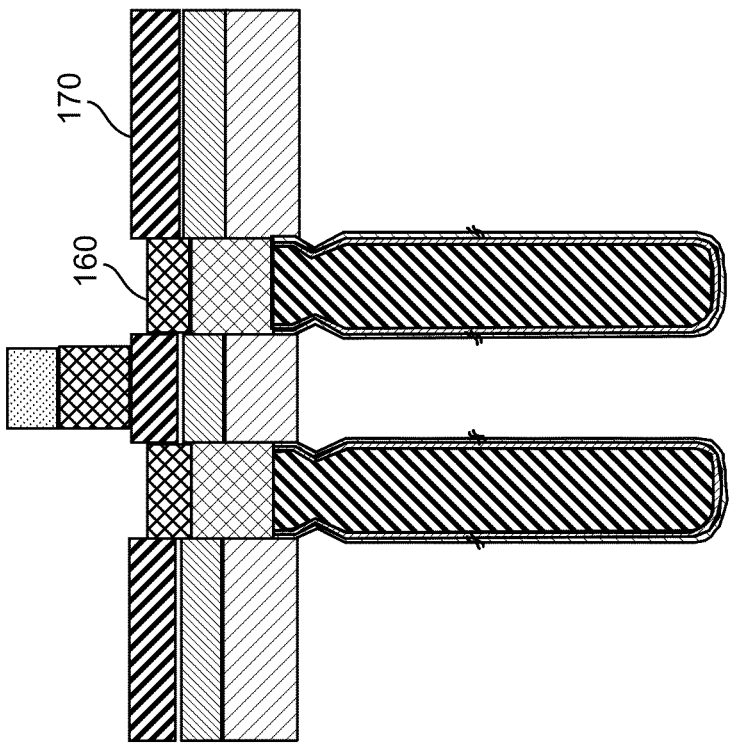
Figure 26B:
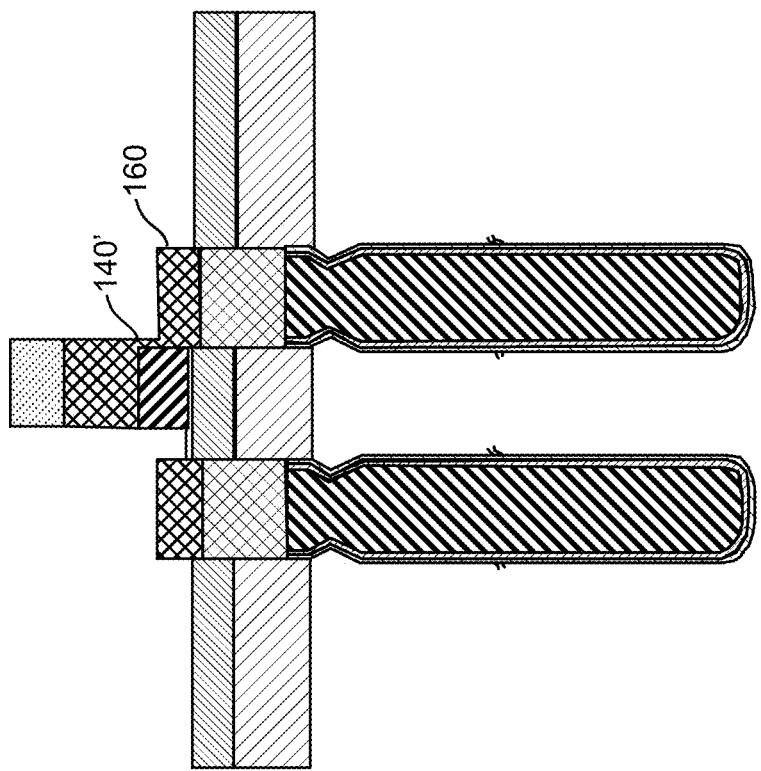
Figure 26A:
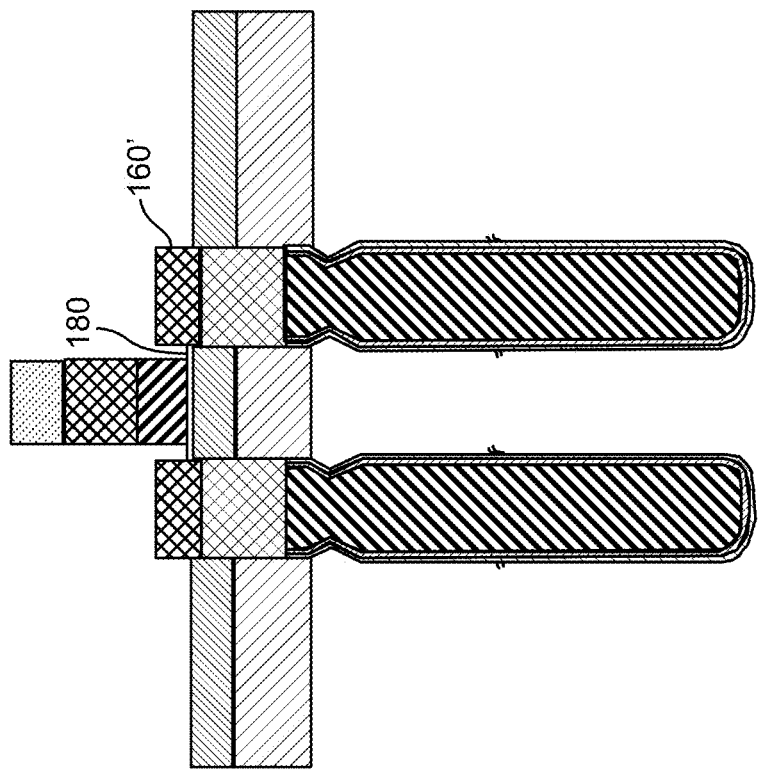
Figure 27B:
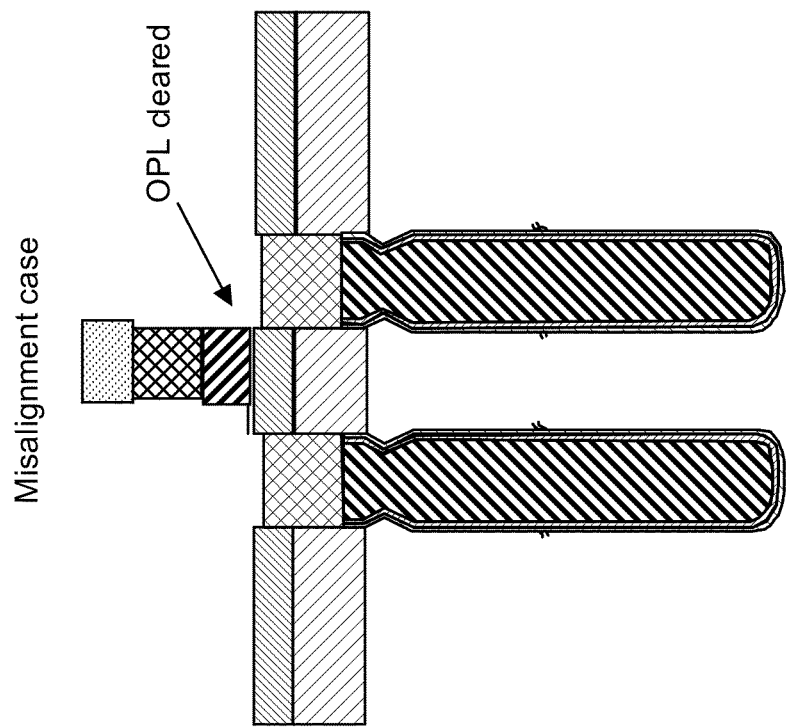
Figure 27A:
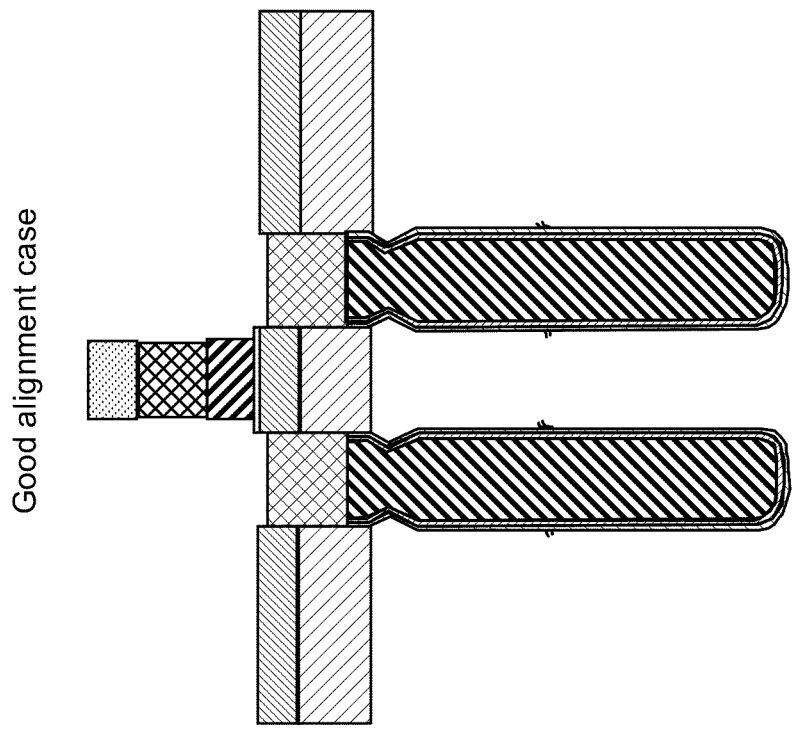
Figure 28B:
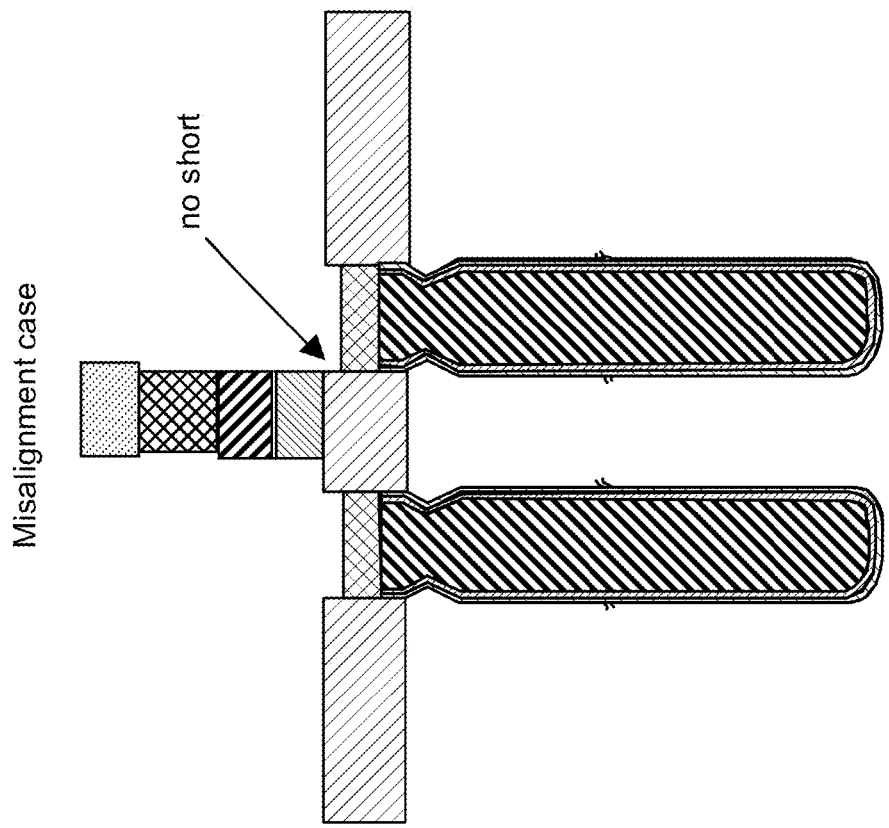
Figure 28A:
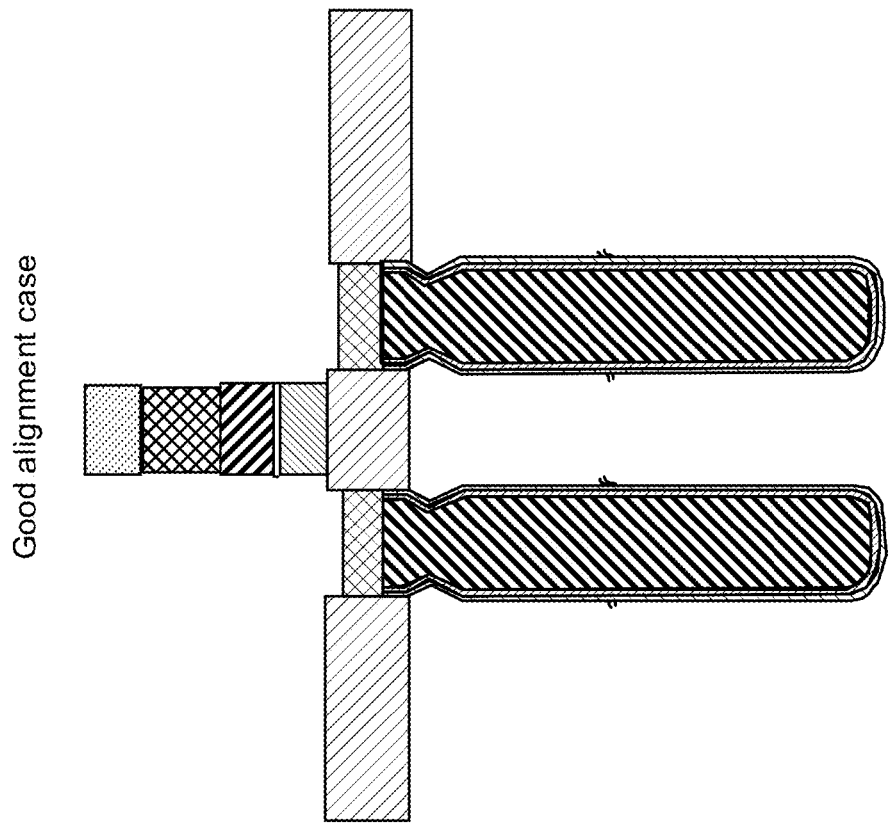
Figure 29B:
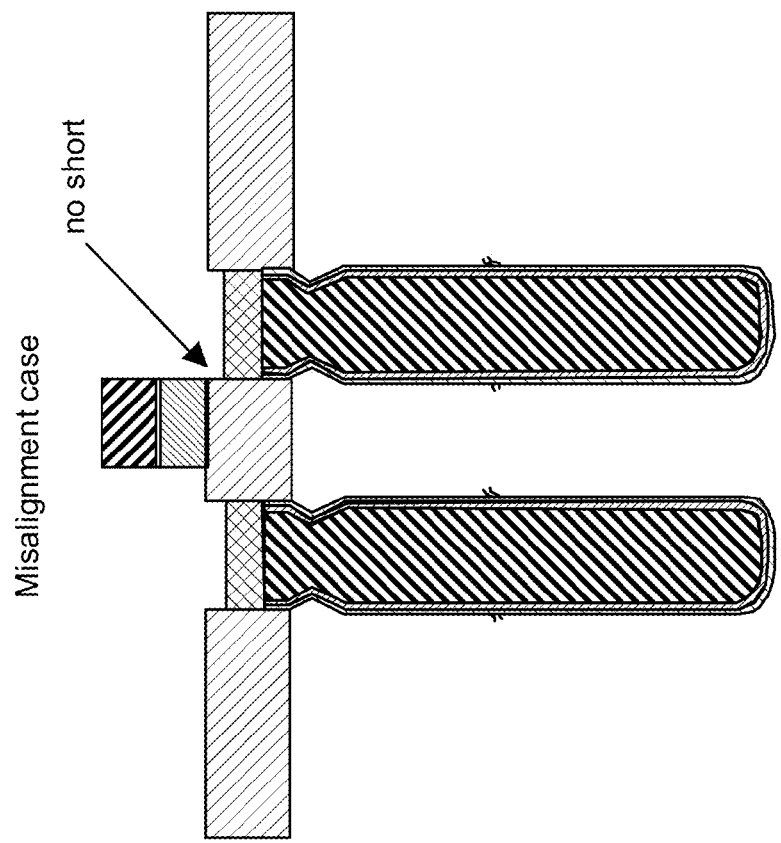
Figure 29A:
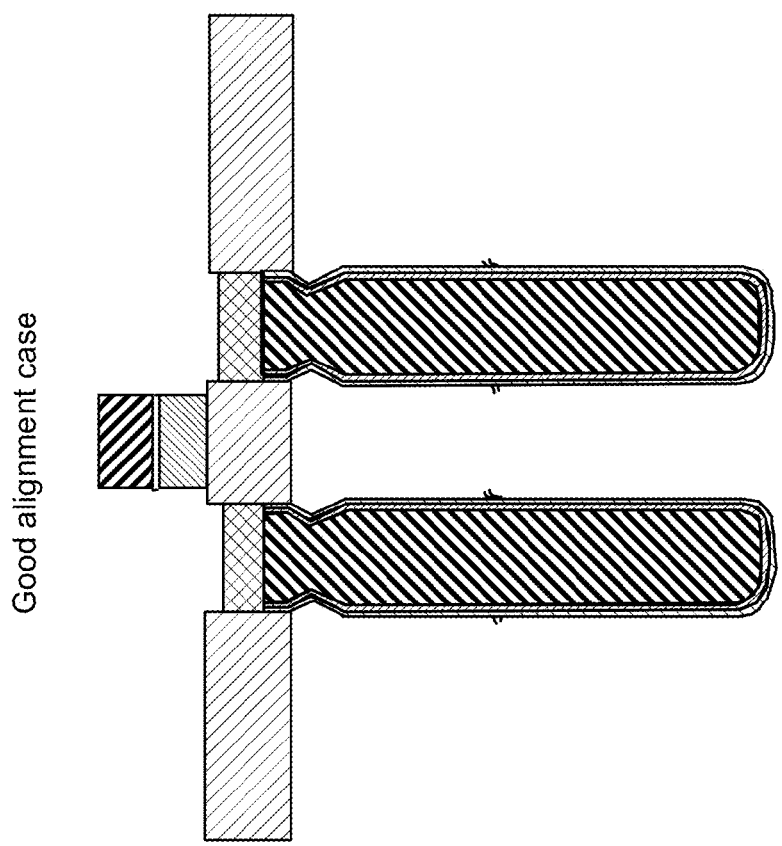

Referring now to FIGS. 24A and 24B which are identical to FIGS. 19A and 19B (but which are repeated for continuity of description of the invention, the cases of properly aligned resist 130 and misaligned resist 130' are again illustrated. As discussed above in connection with FIGS. 12A and 12B, when the OPL material is etched, a timed etch of reduced duration is performed allowing a plug of OPL material to remain over the entire surface of doped polysilicon fill 34 as shown at 160 of FIGS. 25A and 25B. In FIG. 25B, due to resist misalignment a portion of the OPL material remains above doped polysilicon fill 34 and a portion of the OPL plug. Thereafter, when the pad nitride is etched, OPL material remains at location 140' while the pad nitride is recessed from the OPL plug elsewhere as shown, for example, at 180 of FIG. 26A. Then, when the OPL plugs are removed, the doped polysilicon fill 34 is completely exposed due to lateral etching of the OPL that remained due to the resist misalignment. It is important to note in this regard that the OPL plug removal in FIG. 16B illustrated material removal only in the vertical direction as would occur with an anisotropic etch although the material removal is preferably performed as an isotropic etch. Thus, as shown in FIG. 27B, a lateral component of the OPL plug is removed by lateral etching in a well-controlled manner. Excessive OPL plug lateral etching can reduce the strap region as shown in FIG. 30C or beyond. The lateral component of OPL plug etching can be controlled by changing gas pressure and other conditions, particularly reducing HBr concentration and increasing oxygen gas flow rate. The amount of the lateral material removal can be based on the balance or trade-off between alignment error and strap resistance increase. That is, when overlay or alignment error is a significant factor in loss of manufacturing yield, lateral etch can be more aggressive, even though desirably low strap resistance may be compromised. Therefore, the doped polysilicon fill 34 can be recessed properly in the normal manner to a point below the remaining SOI and no shorting of the DT capacitor thereto can occur, regardless of misalignment of resist 130', as shown at FIGS. 28A, 28B, 29A and 29B. In this regard, it should be noted that the remaining SOI is protected by the pad nitride and no dimensional change occurs.

Figure 30A:
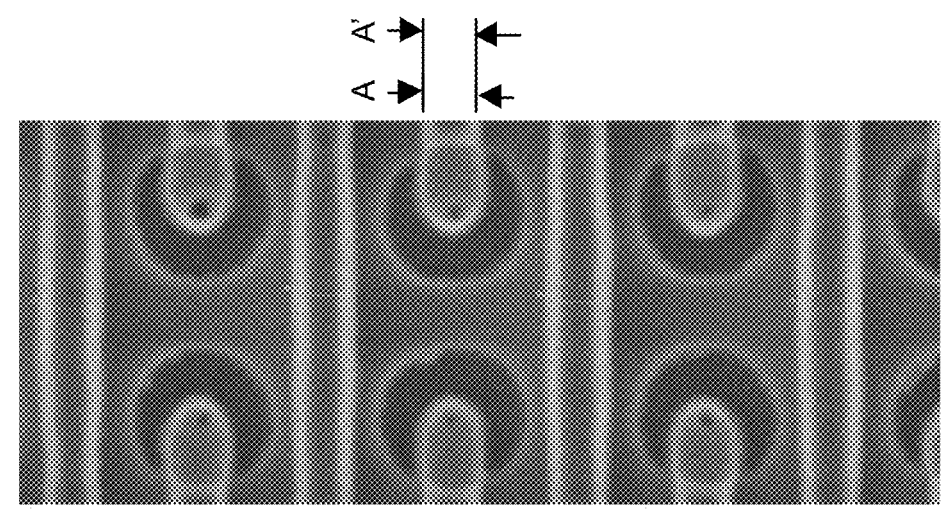
FIGS. 30A, 30B and 30C are scanning electron microscope images illustrating the effectiveness of the invention to engender overlay error tolerance.
Figure 30B:
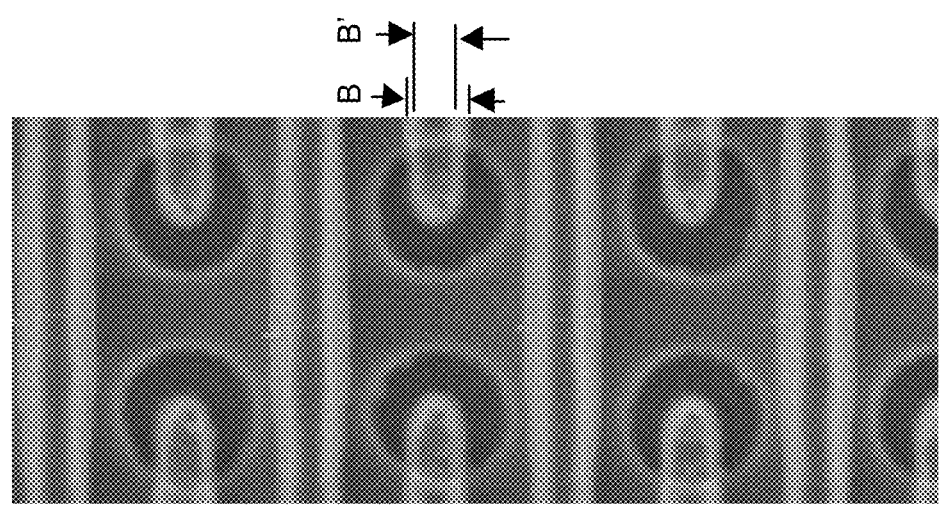
Figure 30C:
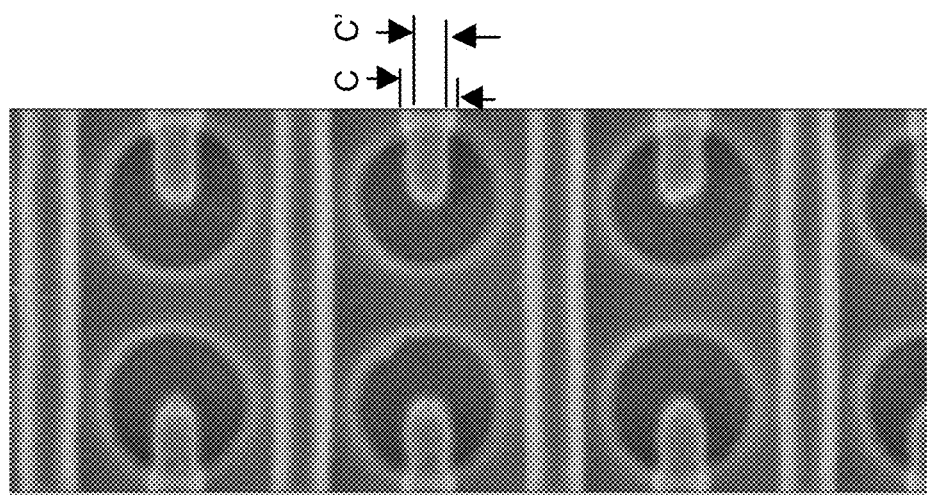

The efficacy of the invention to provide both an avoidance of defects due to non-uniformity of etching rates and to provide an increased tolerance for overlay misalignment errors when connections are made can be readily appreciated from the SEM images shown in FIGS. 30A-30C. FIG. 30A may be regarded as showing the strap connections as would be formed by a conventional process or in accordance with the invention where no misalignment was presented. That is, even in accordance with the invention, no lateral component of OPL etching is present or required and adequate spacing A' and strap connection width A are substantially equal and adequate when overlay accuracy is good. FIGS. 30B and 30C, however, may be regarded as cases where misalignment is present to different degrees (misalignment in FIG. 30C being larger where more aggressive lateral OPL etching is performed) even though misalignment is not evident in these images. Lateral etching can be performed regardless of whether or not misalignment is present but would ordinarily not be performed unless needed. In this regard, lateral etching may be selectively performed based on whether or not resting at the wafer level shows that it is necessary or desirable. Thus FIG. 30B shows a reduction in strap connection width B' and increased clearance (B−B'/2) between the active layer and the next tow storage node in the case of misalignment. The amount of clearance can remove the parasitic connection shown in FIG. 18D. The process without a lateral etch component, resulting in the structure of FIG. 30A cannot remove the parasitic connection without strap width reduction and will cause the memory cell (and others to which a connection is mad) to become inoperable. FIG. 30C, depicting more aggressive lateral etching illustrates a further decreased strap connection width C' and further increased clearance C (e.g. C–C'/2). In summary, in all of these Figures, the pattern inside of the circles is defined by the OPL material. In the case of lateral OPL plug removal (e.g. where misalignment has occurred), the patterns are made smaller by an amount corresponding to the lateral OPL removal.

In view of the foregoing, it is clearly seen that the invention, by the simple expedient of leaving OPL material plugs in place in apertures through partial OPL material etching and removal of the OPL material plugs after other etching processes have been performed that reduces process variations and protects against the underlayer of metal or metal nitride from being exposed, thus improving manufacturing yield. Increased process parameter windows and increased tolerance of overlay error are also provided by a simple, and non-critical process that does not significantly increase process complexity or cost.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of semiconductor device manufacture including a plurality of electronic elements formed on or in a semiconductor chip, said method comprising steps of
    forming apertures in a layer of material extending over other material comprising an electronic element,
    depositing semiconductor material in said apertures,
    recessing said semiconductor material in said apertures such that a surface of said semiconductor material is at a location intermediate between upper and lower surfaces of said layer of material,
    applying an organic planarizing layer (OPL) over a surface of said layer of material and within said apertures,
    partially removing said OPL within said apertures to form OPL plugs in said apertures, said OPL plugs being of differing thickness due to differing etch rates in different areas of said semiconductor chip,
    performing a material removal process on said layer of material around said apertures or OPL plugs, and
    removing said OPL plugs selectively to said layer of material and said semiconductor material whereby differences in amount of material removal due to said differing etch rates at different locations on said semiconductor chip are absorbed by said OPL plugs and said location of said surface of said semiconductor material remains between said upper and lower surfaces of said layer of material.

2. The method as recited in claim 1 wherein said semiconductor device includes a memory array.

3. The method as recited in claim 1, wherein said step of removal of said OPL plugs includes etching having a lateral component.

4. The method as recited in claim 1, wherein a material removal process prior to OPL plug removal is selective to said OPL material.

5. The method as recited in claim 1 wherein said material removal process includes $CHF_3$ or $CF_4$ gas.

6. The method as recited in claim 1 wherein OPL removal includes HBr, $O_2$ or $CO_2$.

7. The method as recited in claim 1 wherein said aperture is formed above an electronic element.

8. The method as recited in claim 7 wherein said electronic element is a storage node.

9. The method as recited in claim 8 wherein said storage node is a capacitor.

10. The method as recited in claim 9 wherein said capacitor is a deep trench capacitor.

11. A method of semiconductor device manufacture wherein said semiconductor device comprises a plurality of electronic devices formed on or in a semiconductor chip, said method comprising steps of
    forming an aperture in a layer of material extending over other material comprising an electronic device,
    depositing semiconductor material in said aperture,
    recessing said semiconductor material in said aperture such that a surface of said semiconductor material is at a location intermediate between upper and lower surfaces of said layer of material,
    applying an organic planarizing layer (OPL) over a surface of said layer of material and within said aperture,
    partially removing said OPL within said apertures to form an OPL plug within said aperture, said OPL plug being of a thickness determined by etch rate during a timed etch,
    performing a material removal operation to remove material from said layer of material,
    removing said OPL plug within said aperture selectively to material of said layer of material, said step of removing said OPL plug within said apertures including lateral etching of OPL material and other exposed material in said aperture whereby differences in thickness of said OPL plugs due to differences in etch rate at different locations on said semiconductor chip do not transfer to etching of said semiconductor material and said location of said surface of said semiconductor material remains between said upper and lower surfaces of said layer of material.

12. The method as recited in claim 11 wherein said semiconductor device includes a memory array.

13. The method as recited in claim 11, wherein a material removal process prior to removal of said OPL plugs is selective to material of said OPL layer.

14. The method as recited in claim 11 wherein said material removal operation includes $CHF_3$ or $CF_4$ gas.

15. The method as recited in claim 11 wherein said aperture is formed above an electronic element.

16. The method as recited in claim 15 wherein said electronic element is a storage node.

17. The method as recited in claim 15 wherein said electronic element is a deep trench capacitor.

* * * * *